(12) United States Patent
Kambara

(10) Patent No.: US 7,762,184 B2
(45) Date of Patent: Jul. 27, 2010

(54) PRODUCTION UNIT INCLUDING A PRINTING DEVICE AND UPPER AND LOWER SEALED CHAMBERS

(75) Inventor: Kenji Kambara, Shiga (JP)

(73) Assignee: Tokai Shoji Co., Ltd., Tokyo (JP)

( * ) Notice: Subject to any disclaimer, the term of this patent is extended or adjusted under 35 U.S.C. 154(b) by 122 days.

(21) Appl. No.: 11/959,776

(22) Filed: Dec. 19, 2007

(65) Prior Publication Data

US 2009/0000498 A1 Jan. 1, 2009

Related U.S. Application Data

(62) Division of application No. 11/036,820, filed on Jan. 14, 2005, now Pat. No. 7,383,770.

(30) Foreign Application Priority Data

Jan. 14, 2004 (JP) ............................. 2004-007002
Nov. 15, 2004 (JP) ............................. 2004-329980

(51) Int. Cl.
*B41F 15/08* (2006.01)
(52) U.S. Cl. ...................... 101/114; 101/126; 101/123
(58) Field of Classification Search ................ 101/123, 101/114, 124, 129, 126; *B41F 15/44*
See application file for complete search history.

(56) References Cited

U.S. PATENT DOCUMENTS 5,669,303 A * 9/1997 Maracas et al. ............. 101/327
6,240,840 B1 * 6/2001 Murakami ................... 101/114
2006/0086269 A1 * 4/2006 Tanaka ........................ 101/129

FOREIGN PATENT DOCUMENTS

JP 09239953 A * 9/1997

OTHER PUBLICATIONS

Partial English language translation of JP 09-239953, which has a publication dated of Sep. 1997.*

* cited by examiner

*Primary Examiner*—Leslie J Evanisko
(74) *Attorney, Agent, or Firm*—Weiner & Burt, P.C.; Irving M. Weiner; Pamela S. Burt

(57) ABSTRACT

A printing device, a production unit and a production method of electronic parts suitable for production of precise electronic parts are provided. A squeegee is attached to a rotating machine, and is autorotated and self-driven, and moreover, a printing pressure is generated in the squeegee, and resin is strongly filled, thereby achieving a print having a precision-shape. Further, with a perforated plate as a boundary, upper and lower chambers are provided so as to control a pressure, thereby performing cutting and dispensing of the resin and achieving a print having a precision-shape. This method is applied to the packaging of electronic parts. A printing device E1 comprises: a roller 3 allowing a peripheral surface 32 to approach one side 21 of a circuit board 2; moving means 4 for horizontally moving the roller 3; rotating means 5 for allowing the moving means 4 to rotate the roller 3; a squeegee 6 rotatably supported along the peripheral surface 32 of the roller 3; and printing pressure generating means 7 for pressing the squeegee 6 to the circuit board 2 by a rotating reactive force of the roller 3.

1 Claim, 17 Drawing Sheets

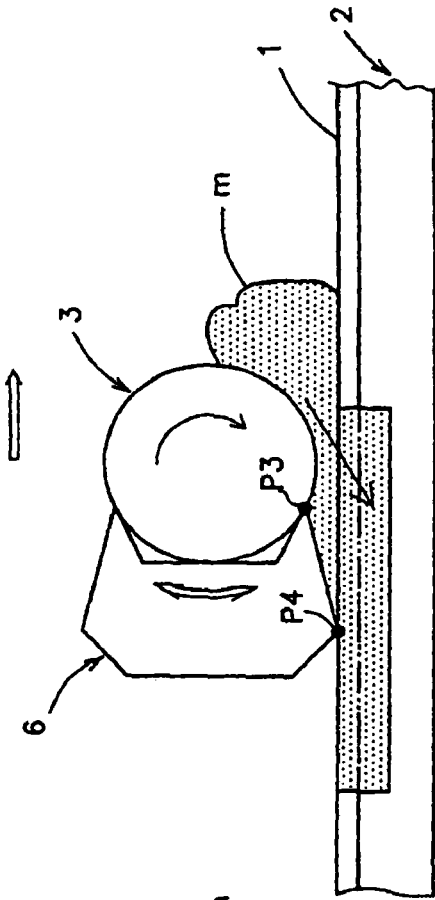
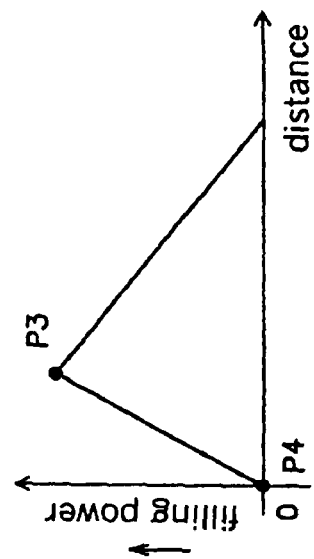
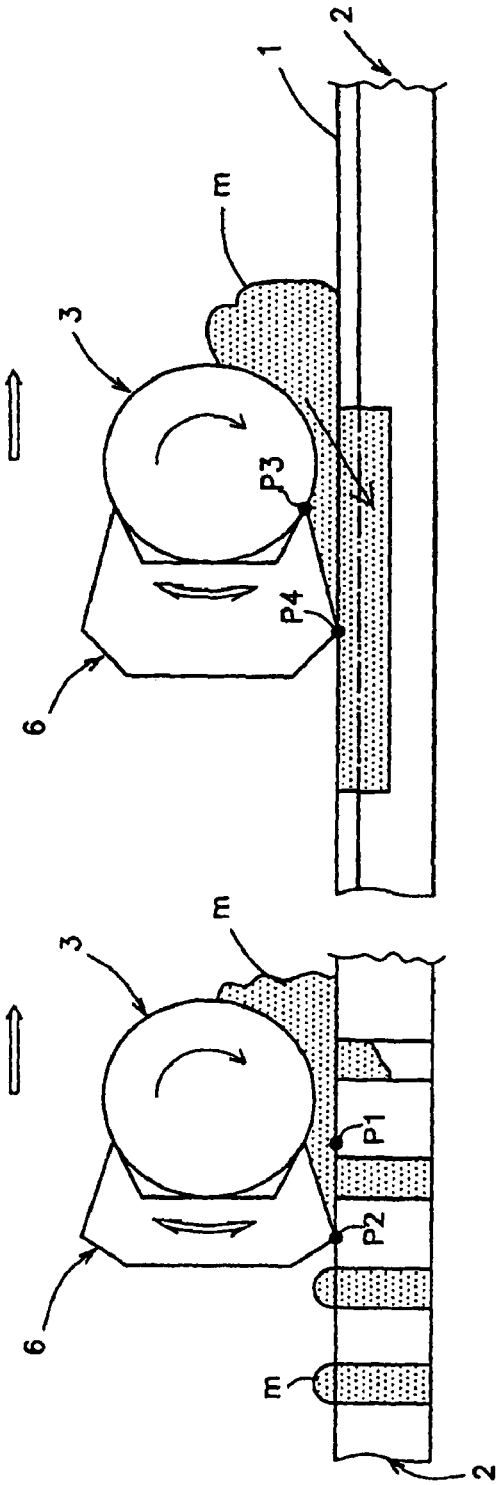
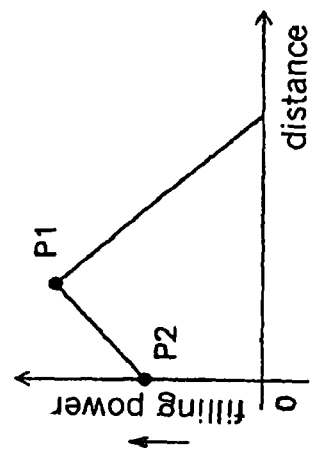

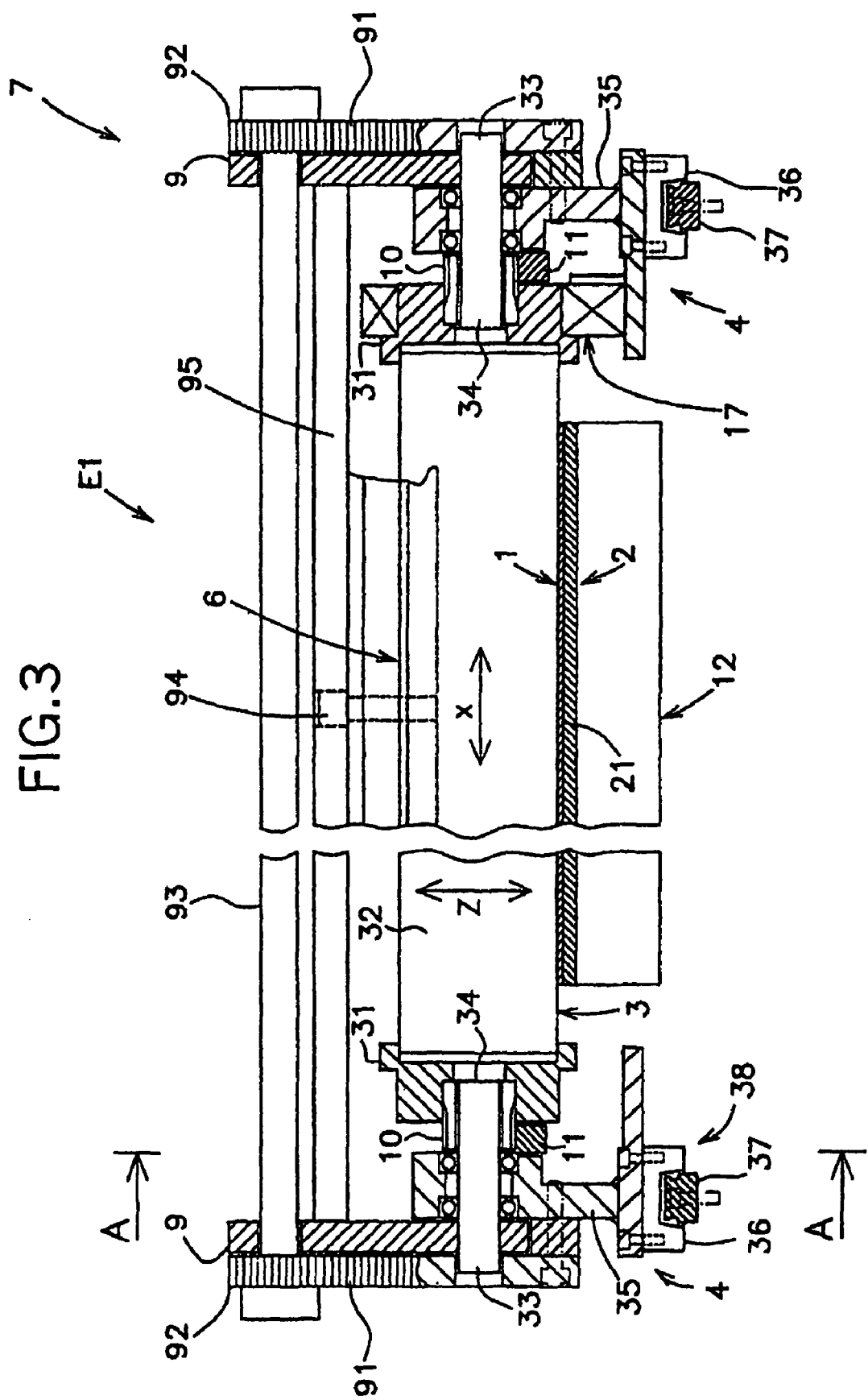

reciprocating ←Y→ outgoing sectional view cut along the line A-A

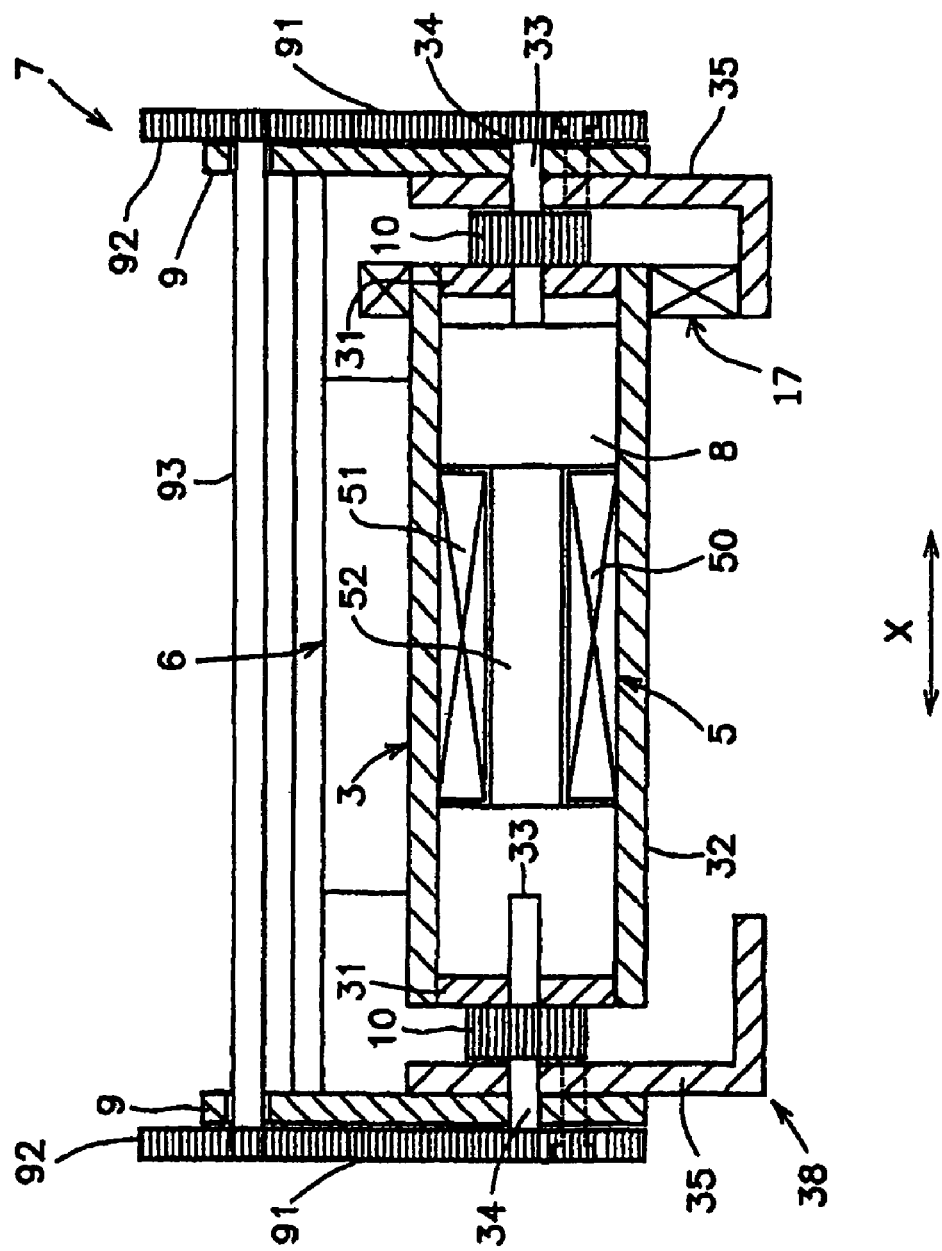

pipe arrangement distribution diagram

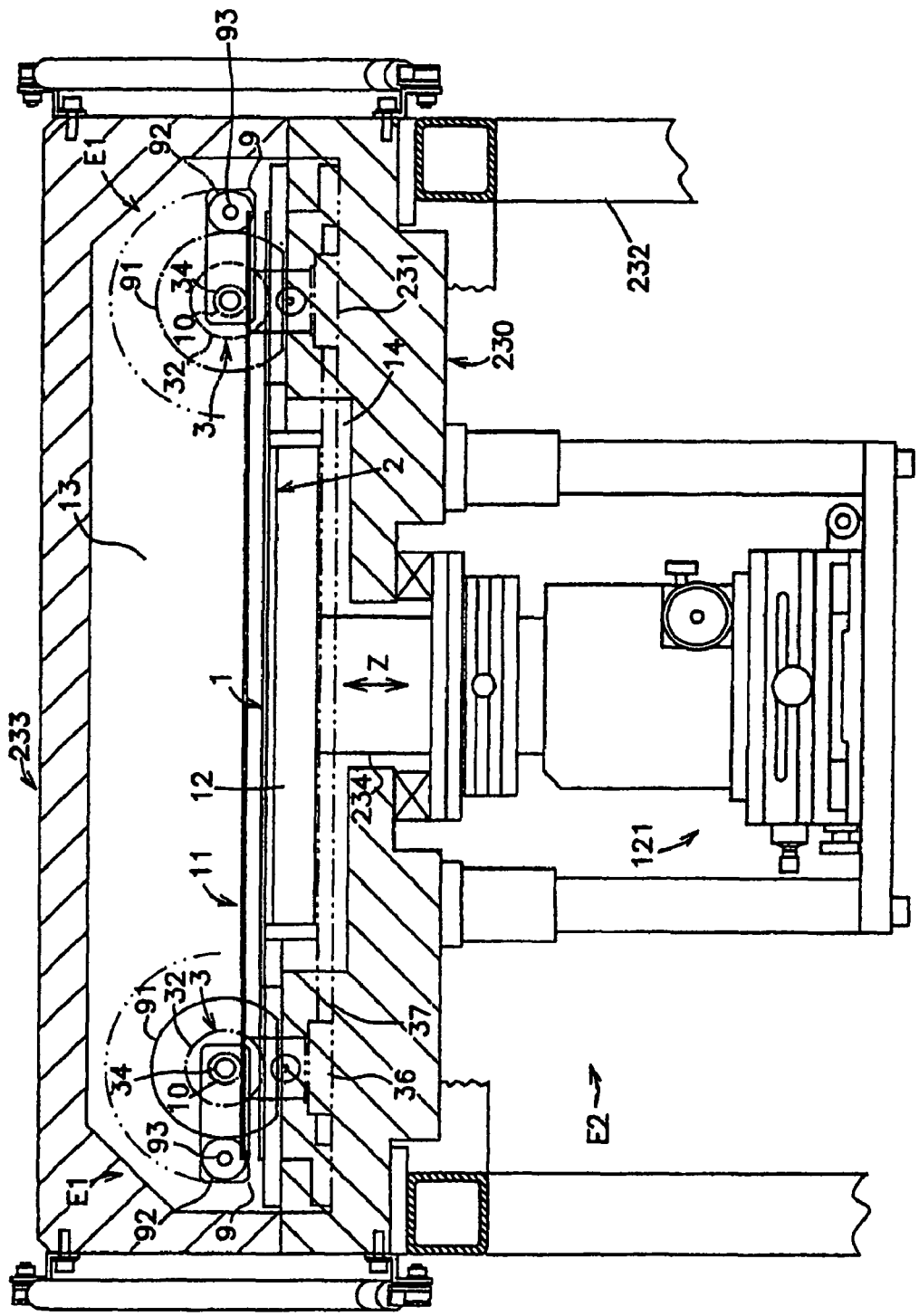

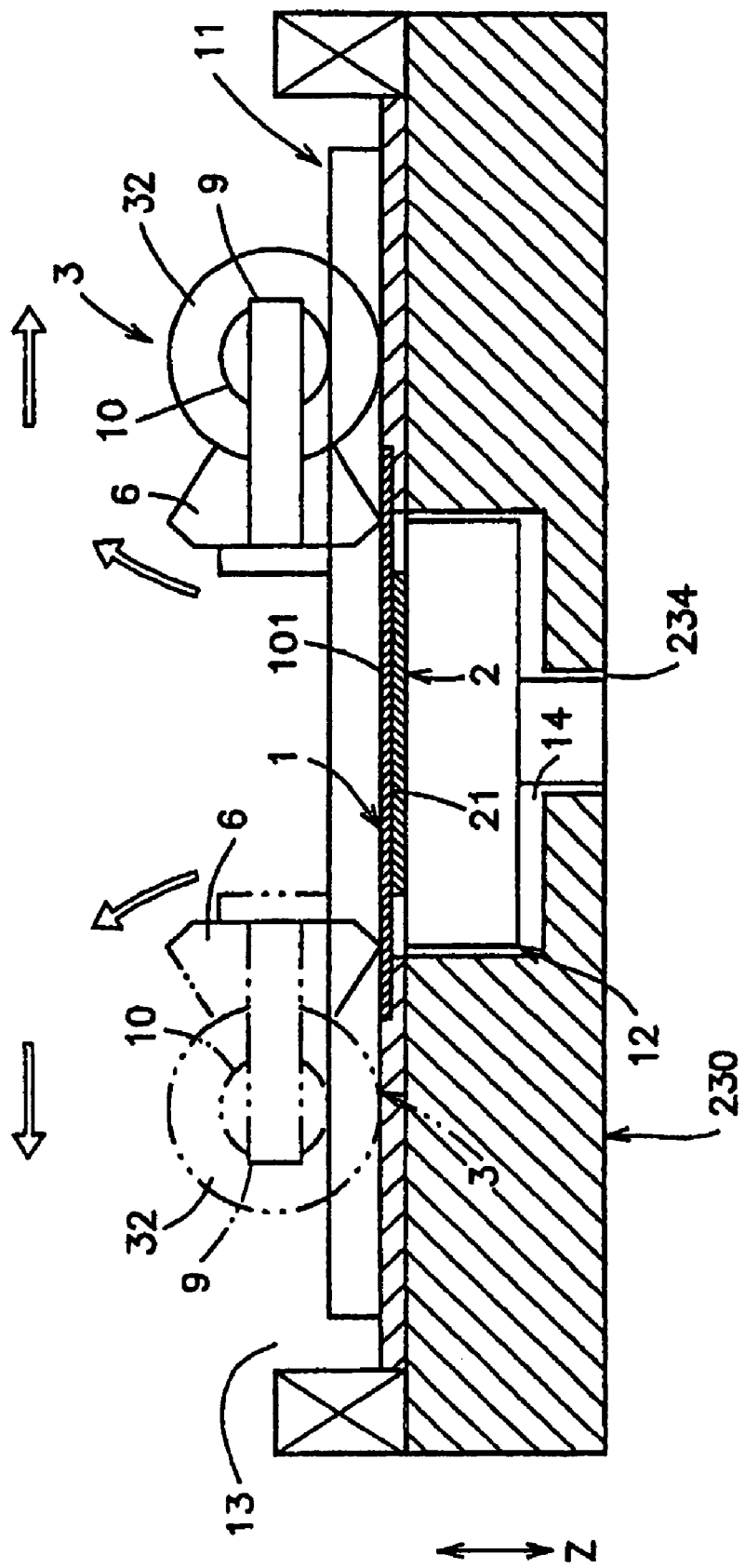

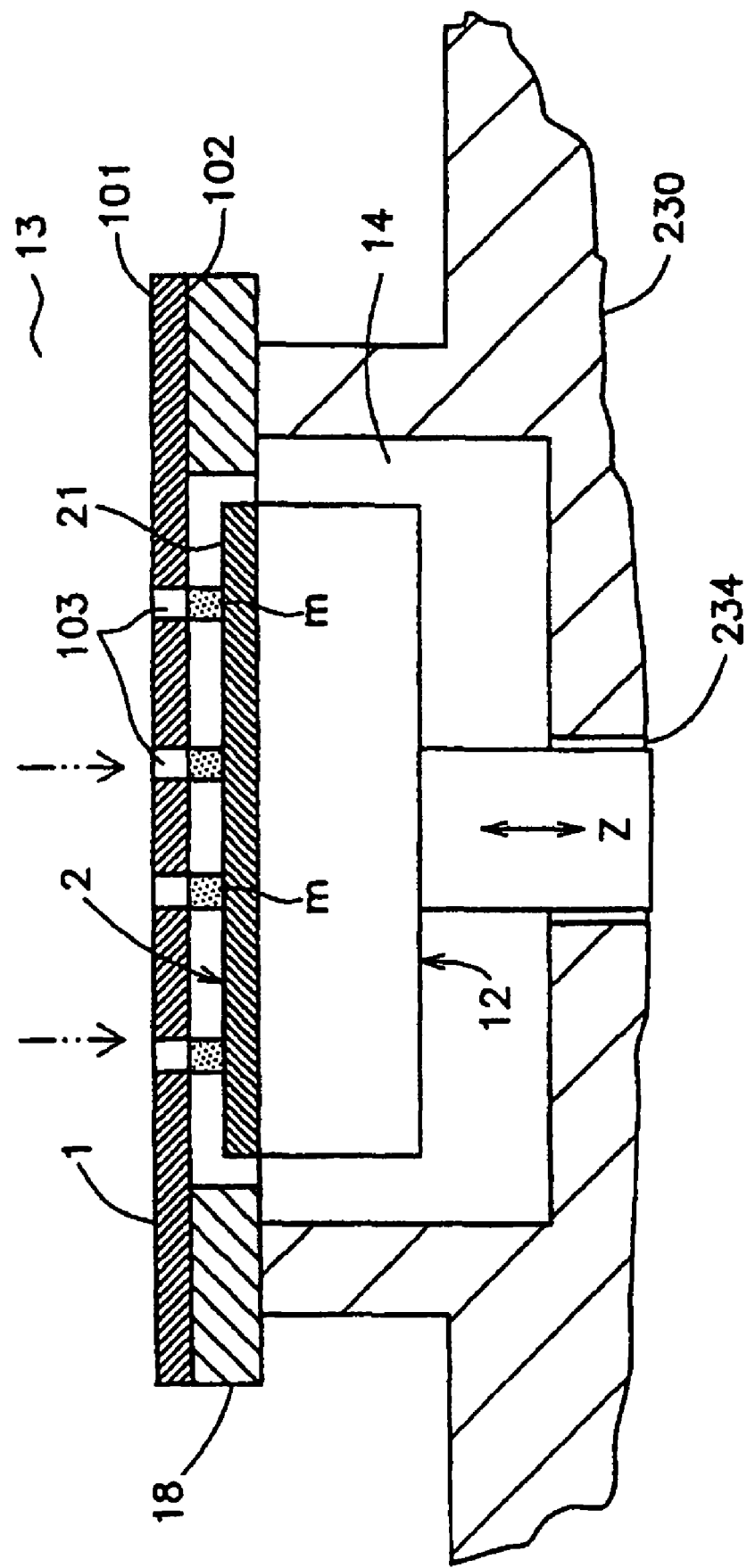

PRODUCTION UNIT INCLUDING A PRINTING DEVICE AND UPPER AND LOWER SEALED CHAMBERS

CROSS-REFERENCE TO RELATED APPLICATIONS

This application is a divisional of U.S. application Ser. No. 11/036,820 filed Jan. 14, 2005, now U.S. Pat. No. 7,383,770, patented Jun. 10, 2008.

BACKGROUND OF THE INVENTION

1. Technical Field of the Invention

The present invention relates to a printing device, a production unit, and a production method of electronic parts, which perform a resin encapsulation having a voidless precise shape of the electronic parts, the forming of a solder bump, the hole-plugging of a substrate or dispensing and the like.

2. Description of the Related Art

A conventional technology is disclosed in the following documents. For example, as a conventional packaging technology, it is well known that an integrated circuit formed on a work piece is encapsulated (packaged). While the mainstream of such technology is a transfer molding method, as a method of using a plastic material comprising liquid synthetic resin, a dispenser method and a printing method are generally known. As for the printing method, a method of de-gassing by performing an atmospheric printing and a vacuum differential pressure printing method are commonly known. For a ceramic substrate, the vacuum differential pressure printing method is mainly adopted. With respect to the plastic material substrate, though this method is partially adopted and its usage is gradually growing, because of various problems involved, the method has not yet taken root in the industry. Further, the method is also applied to the CSP production process of a wafer level or its encapsulation. From now onward, since shifting to complexity, three dimensions, or built-in substrates of the electronic parts are promoted, there is a demand for an encapsulation method having a voidless precision-shape.

Patent Document 1: Japanese Patent No 3198273
Patent Document 2: Japanese Patent No 3084440
Patent Document 3: Japanese Patent Application No. 2001-331497 (Laid-open Publication No. 2003-133739)
Patent Document 4: Japanese Patent No. 3113974
Patent Document 5: Japanese Patent No. 2873501
Patent Document 6: Japanese Patent Application Laid-Open Publication No. 5-90271
Patent Document 7: Japanese Patent Application Laid-Open Publication No. 10-34878
Patent Document 8: Japanese Patent Application Laid-Open Publication No. 2001-232758.
Patent Document 9: Japanese Patent Application Laid-Open Publication No. 2001-232765
Non-Patent Document 1: "Electronic Journal", April 2003, pp. 122-124. "Bump Forming Device for lead-free soldering".

With respect to the solder bump formation, the printing method has recently come to draw attention as against a conventional transfer method. An important technology is how quantitatively a high viscose solder paste is voidlessly filled into a perforated plate having a high aspect ratio by corresponding to a narrow pitching shift, and various techniques have been proposed. With respect to the head of the printing device using an atmospheric printing machine, such a type as performing a printing or being filled by an open type squeegee, an encapsulated type squeegee, a press-fit type squeegee, and a roller press-fit type squeegee is introduced. Further, there is also a method in which a photosensitive dry film is laminated by the bump formation of a wafer so as to form a via, and a solder paste is filled by the printing method, and a bump is formed by reflowing, thereby peeling off a film.

For the hole-plugging of vias and through holes of the printed circuit board and a wafer substrate a conductive paste and a non-conductive paste are used, and there is a hole-plugging method by the atmospheric printing or a vacuum difference pressure printing method using a squeegee. A development which seeks for a simpler and lower cost process by a mass lamination method is under way. In the printing method of the conductive paste, the development of the paste by aiming at improvement of electrical performance and reliability is promoted. Although the vacuum printing method of filling the paste voidlessly and simply into various vias is going into practical use, since there are defects such as the device being on a grand scale, and the productivity thereof being low, the modification thereof is solicited. Further, the plugging of the through hole is performed by using a mask and a jig in such a way that the work piece is positioned and filled with resin, and further, a plug is formed on the upper surface and the lower surface of the work, and then, it is cured, and both surfaces of the work is polished and made flat.

A principle of printing a high viscose resin flatly in a shape having a clearance gap by a squeegee by using a perforated plate is not established. As shown in FIG. 15(A), a resin m having adhered to a squeegee 60 and a work piece 2 has vertically clearance gaps at an opening portion 103 of a perforated plate 1, and a velocity gradient is generated for the movement of the squeegee 60, and the rear resin m is drawn out so as to be printed several tens μ thinner than a prescribed thickness. This is a resin feeding method not influenced by viscosity and clearance gap.

At the end edge of the opening portion 103 of the perforated plate 1, as shown in FIG. 15(B), the resin m pressed by the squeegee 60 is stemmed at the end portion of the opening portion 103, and is further pressurized and released at the passing time of the squeegee 60 so as to be printed several tens μ thicker than a prescribed thickness. This is a method of maintaining a filling pressure of the top end portion of the squeegee unchanged all the time regardless of the shape of the mask and the work piece 2.

The opening portion 103 of the perforated plate 1 shown in FIG. 15 and, though not shown, a printing starting portion of a groove between chips within the opening portion 103 are not capable of achieving a filling pressure of the squeegee 60, and end up being unfilled or cannot print but only thinly, thereby creating a void generating cause. The liquid resin due to the above described three factors is unable to be printed in a precise shape, and though a countermeasure was forcibly taken by futile operations of the shape of the mask and squeegee 60 in addition to a low viscosity of resin by sacrificing the reliability, a basic solution has not been reached. This is a resin feeding method having a strong filling force not affected by the shape of a printing portion.

The high-viscosity resin, which is wire-bonded in high density by encapsulation of BGA and CSP such as a lamination type and the like in a state in which a net is put up and is fed with a filler and the like at a high percentage, can be hardly filled by a squeegee function. Hence, when the resin is printed in the vacuum and is applied with a vacuum differential pressure, though a filling efficiency can be expected to some extent, there exists no mechanism to remove the residual void, and the void is miniaturized and dispersed and remains. Basically, before the differential pressure is applied, it is a necessary condition that the resin fills a cavity and pushes out the air. An extremely thin package has a wire close to its surface, and is short-circuited with the cavity with no differential pressure generated, and is at high risk of generating a void. Further, the packaging three-dimensionally laminated is wire-bonded in high density and moreover is Philip-chipped, and a filling is required even in microgaps, and therefore, a method having a strong filling function and capable of a precise printing is indispensable. Further, with respect to the building of the electronic parts into the substrate, a voidless filling of the liquid resin and a coating of a uniform thickness are required. This is excellent filling and voidless filling methods not affected by viscosity.

In case the vias of the wafer substrate and the laminated substrate are filled with various resins, a strong printing pressure is required, and due to inroad of the squeegee and viscosity of the resins, the resins are scooped out from the vias, and moreover, are contracted by curing. To prevent this from occurring, by using various masks, a precise positioning of the masks is made, and the resin is filled into them and interpolated, but a convex solid plug is formed, and the polishing of such a plug entails great difficulties. This is a hole-plugging method in which a filling is directly made on the work piece 2 without having a perforated plate, a precise positioning device, and a cleaning device at all, and which can cover a concave portion and a shrinkage of the resin voidlessly, and can limit a polishing working process to the minimum possible.

Specifically, a mask is positioned on the upper surface of the work, and at the bottom thereof, a jig to form a plug is positioned, and a printing is performed so that a plug (convex printing) is formed on both sides of the work, and this plug is cured and polished. In this case, the holes having different diameters are separated and printed, and curing-polishing is performed for every hole diameter. Further, because of shifting to the miniaturization and a large scale substrate, the position of the pattern of the mask and the position of the pattern of the work are not matched due to elongation of a mask and elongation of a work caused by polishing, and there are often the cases where the printing is required twice. When the plug is formed, a polishing thereof entails difficulties, and a device is required in which it is difficult to uniformly polish the plug and a copper plating and control the thickness and elongation thereof. When voidlessness is required, it necessitates a printing in the vacuum, and when the mask exists, a device comprising a positioning, a cleaning and the like is required, and such a device becomes large-sized like a plant and expensive, and moreover, becomes low in productivity. Hence, a plugging method of forming a plug voidless without using the jig and the mask, and capable of simultaneously filling the holes of different diameters and limiting the working process to the minimum possible is required.

Solder paste printing methods by the bump formation of the solder according to Japanese Patent Application Laid-Open Publication No. 2001-232758 and Japanese Patent Application Laid-Open Publication No. 10-34878 have been proposed. The worst weakness of these methods is that the resin is filled by the rotation of a roller and using a mask, and the residual resin is then removed by a scraper or a blade, and therefore this technique only provides a extremely weak filling force. In this method, a range of a half of a roller 30 contributes to the filling, and the other half interfere with the resin fill. To compensate for this, Japanese Patent Application Laid-Open Publication No. 2001-232758 performs an application of air pressure, but the distance involved is long, and there is a change also in an amount of resin, and high viscose resin does not react uniformly. As a whole, this leads to a considerable large-scale device, and therefore, it is difficult to be applied to a vacuum device.

Further, describing these systems with reference to FIGS. 16(A) and 16(B), the perforated plate (mask) 1 and the roller 30 are adjacent to each other so as to stop and fill a resin m. In case a filling is made into a wide space of the perforated plate 1 or the work 2, the resin m only circulates around the roller 30 as indicated by an arrow mark 30$x$ or an arrow mark 30$y$, and has an extremely great defect, which does not contribute to the filling.

According to Japanese Patent Application Laid-Open Publication No. 2001-232765, the difference between a force for pulling back the resin m by the rear part of the roller and a whole pressurization of the resin m becomes an inner pressure, and when this inner pressure is increased, the resin m cannot be stopped by the scraper, but pushed back and thickly printed. Even when the space to be filled is small, a most part of the resin contributes to the filling, but since the force of pulling back the resin m in the midst of being filled gains in strength, a strong filling cannot be achieved, and there is no way to control a print shape.

Japanese Patent Application Laid-Open Publication No. 10-34878 has also an advantage of contributing to the force of filling the half of the roller in a small space, but it is weak, and the resin is pulled back by the rear portion of the roller 30, and the pressure between a rear portion blade and the rear portion of the roller 30 is unstable, and is unable to control the print shape. Further, the printing method having the above described blade and scrapper shape has a defect in that, when a printing is directly made on the substrate formed by resist, the resist is broken and peeled off. A method by a perforated plate system in the bump formation in which the miniaturizations progressed has reached critical limit, and the majority of methods are turning into the system in which a pattern is formed by resist. There is a demand for a basic factor innovation capable of precisely printing either in flatness or convexity by a strong filling force directly on a work which requires a space by various shapes.

According to Japanese Patent Application Laid Open Publication No. 2001-232758 the periphery of the roller is wrapped by a solid frame, and the replacement of the resin is extremely difficult. This device has to be disassembled and cleaned. In recent years, even the type of solder alone has come to have a great choice. Further, this device is required to be subjected to resin sealing and various types of hole-plugging, but a crucial point of the practical application thereof is whether or not the replacement of the resin can be simply performed with a minimum possible solution. The structure of the device has to be such that a portion which contacts the resin has a squeegee simply removable with a piece of roll left and can be easily cleaned.

Furthermore, since the periphery of the roller is completely sealed, this system takes air even at the boundary between the mask and the scraper. Also according to Japanese Patent Application Laid-Open Publication No. 34878, when the substrate formed with the vias by various methods such as resist and the like is filled with the solder paste, the air inside the vias is taken into the resin, and the resin continues to rotate around the roller, and the solder paste containing large quantities of void accumulated in proportion to the travel distance is fed. Even when the resin is filled, the quantity of solder is reduced, and a precise bump is not produced, and void is also contained inside the solder. Further, the recent solder has become miniaturized in a ball and extremely prone to oxidation, and this creates a great problem for melting of the solder in the subsequent working process.

Further, according to the above described vacuum differential pressure printing method, in the printing process for pressing and filling a plastic material m into the work piece 2, since the plastic material strongly adheres to the work piece 2 and the perforated plate 1, in the process for separating the perforated plate 1 from the work piece 2, it becomes difficult to separate this plastic material. In this way, there arises a problem that the adhering plastic material m hangs down from the perforated plate 1 while adhering to the perforated plate 1 and the shape of an encapsulated portion (package) crumbles.

More particularly, as shown in FIG. 17(A), in case a perforated plate printing method is executed by using a high viscous plastic material m such as resin and the like, the plastic material m adheres to the perforated plate 1 and the work piece (circuit board) 2, and when the work piece 2 is separated from the perforated plate 1, the periphery of the encapsulated portion comprising the plastic material m which forms the encapsulated portion is pulled. In this way, the end portion of the encapsulated portion comprising the plastic material m becomes thick, and its vicinity becomes thin, thereby generating an unevenness in thickness. Furthermore, since the plastic material m hung from the perforated plate 1 adheres to the lower surface of the perforated plate 1 due to a reaction of cutting or drops down to the work piece 2, every time this printing method is executed, the cleaning of the perforated plate 1 or the work piece 2 becomes necessary. Further, this becomes a main cause of varying the quantity of the plastic material m fed to this print.

Further, as shown in FIG. 17(B), to flatten the encapsulated portion having the above described thickness unevenness, though an attempt is made to allow this portion to be left in the atmospheric air for a definite period of time, when the plastic material m becomes a low viscose type in the midst of being cured, there arises a problem that the material m starts flowing out and the shape of the encapsulated portion crumbles. As a countermeasure against this problem, the flowing out of the plastic material m is reduced by a cavity down system or an attempt is made to prepare a dam-shaped gate for regulating the flowing out of the plastic material m by the dispenser and the like, but there arises a problem that the production process thereof is complicated.

In the bump formation of the solder, the viscosity of the solder paste is extremely high, and there are various filling methods proposed. However, because of shifting to a narrow pitch, the aspect ratio becomes large, and a difference between the adhering force of the solder paste filled to the work piece 2 and the adhering force by the area of the side wall becomes small so that a transcription becomes extremely unstable, and there are often the case where the resin comes off from the perforated plate, the case where the resin comes off with a part thereof left, and the case where the resin does not come off at all. These cases are compensated by countermeasures such as the improvement of a shape of the hole of the perforated plate, the improvement of a surface coarseness, and the reduction of a viscosity of the coating of the mold release material. But, it is now required that solder past is not remained in the perforated plate. This is a method of dispensing the solder paste filled in the hole of the perforated plate.

To deal with the miniaturization, though there is a method executed in which a mask is prepared by a resist on the wafer substrate or the resin substrate, and the solder is filled by the atmospheric printing and reflows into the vias so as to remove the resist, when the atmospheric printing is made on blinded vias, the air remains within the interior so that the filling quantities become insufficient. Further, an amount of air proportional to the travel distance is accumulated in a solder during printing so that the quantity of solder becomes insufficient. Moreover, since the squeegee is used, the solder is scooped out by the viscosity of the resin, and is printed in a concave shape so that the quantity of solder becomes insufficient. As a result, there arises a problem of bump accuracy being lowered. Further, this results in the generation of void within the bump. Hence, a method of performing a fixed quantity filling by a voidless solder resin is desired.

SUMMARY OF THE INVENTION

The present invention has been made in view of the above described problems, and an object of the invention is to provide a printing device, a production unit and a production method of electronic parts suitable for the production of precise electronic parts.

The present invention relates to a printing device of electronic parts which presses and fills a plastic material into a work piece horizontally positioned with one side thereof directed upward, and is characterized by comprising: a roller with an end portion supported in a shaft direction in the vicinity of the work piece and a peripheral surface approaching one side of the work piece; moving means for moving the roller along one side of the work piece; rotating means for rotating the roller in a somersaulting direction to a moving direction to which the moving means moves the roller; and a squeegee pressed to one side of the work piece by approaching and contacting the roller.

Further, the present invention relates to a printing device of electronic parts which presses and fills the plastic material into a work piece positioned in a horizontal position with one side thereof directed upward, comprising: a roller with an end portion supported in a shaft direction in the vicinity of the work piece and a peripheral surface approaching one side of the work piece; moving means for moving the roller along one side of the work piece; rotating means for rotating the roller in a somersaulting direction to a moving direction to which the moving means moves the roller; a squeegee rotatably supported along the peripheral surface of the roller by approaching or contacting the roller; and printing pressure generating means for pressing the squeegee to one side of the work piece by a reactive force of the torque by which the rotating means rotates the roller. The concept of the work piece contains at least a work piece, and a surface mount portion such as an integrated circuit and the like which are formed on one side of the work piece.

Further, the rotating means is characterized by comprising: a rotating machine packaged inside the roller having a rotor and a stator relatively rotatable; moving means for moving the roller along one side of the work piece; a support shaft extending to a shaft direction of the roller and penetrating the end portion of the roller so as to allow its top end to protrude outside of said roller; a speed reducer connecting a rotor of the rotating machine to the support shaft; and a link member extending to a radial direction of the roller from the vicinity of the top end of the support shaft and supporting the squeegee; wherein the squeegee receives a reactive force by which the rotor is rotated and driven, and at the same time, the rotation of the rotor is transferred to the support shaft, while being reduced by the speed reducer.

The roller is characterized by comprising an inner casing to house the rotating machine and a cylindrical outer casing arranged around the inner casing and subjected to a rubber-lining, wherein a clearance gap to induce an air is provided between the inner casing and the cylindrical outer casing.

Further, the support shaft is characterized by comprising a hollow shaft having one end vacuumed and the other end communicating with the interior of the roller, and the air in the interior of the roller is vacuumed through the support shaft, so that the roller is forcibly cooled.

Further, the printing pressure generating means is characterized by comprising a braking device for braking the rotation of the roller, wherein, by rotating the link member in an opposite direction to the rotating direction of the roller by the reactive force of the torque, by which the rotating machine allows the roller to rotate, by opposing to the braking of the braking device, the squeegee is pressed to one side of the work piece.

Further, the moving means is characterized by comprising: a pinion having a diameter equal or less than a roller diameter coupled to the end portion of the roller; a rack laid down at the lateral side of the work piece and extending to the moving direction; and a rotating machine having a rotor rotatable within the roller; wherein the rack is engaged with the pinion, and accompanied by rotation of the rotor of the rotating machine, the pinion is rotated together with the roller, thereby moving the roller to the moving direction.

Further, the moving means allows a bracket rotatably supporting the roller to be moved to the moving direction by a driving source provided outside of the roller.

Further, the printing device of electronic parts according to the present invention is characterized in that the perforated plate having a through hole pattern passable by the plastic material is overlaid on one side of the work piece.

The production unit of the electronic parts according to the present invention is characterized by comprising: an upper part sealed chamber housing a printing device for pressing and filling a plastic material into a work piece having one side and a perforated plate having a through hole pattern overlaid on one side of the work piece and passable by the plastic material; a lower part sealed chamber housing an alignment table which is defined within the upper part sealed chamber with the perforated plate spaced apart and is positioned in a horizontal position with one side directed upward and the height of the work piece adjustable; and differential pressure generating means for generating a differential pressure between the upper part sealed chamber and the lower part sealed chamber.

Further, the differential pressure generating means is characterized by comprising: a vacuum pump connected to the upper part sealed chamber and the lower part sealed chamber; two leak valves connected to the upper part sealed chamber and the lower part sealed chamber, respectively; and a stop valve opening and closing between the upper part sealed chamber and the lower part sealed chamber and the vacuum pump; wherein the vacuum pump vacuums the upper part sealed chamber and the lower part sealed chamber, and after printing, by combination of the operations of the two leak valves and the stop valve, the inflow of an atmospheric air to the upper part sealed chamber and the lower part sealed chamber is individually allowed or sealed.

Further, the present invention relates to a production method of electronic parts for pressing and filling a plastic material into a work piece horizontally positioned, and is characterized by including the steps of: positioning the work piece having one side in a horizontal position with one side directed upward; allowing a roller connected to a rotating machine to wait in a horizontal position in the vicinity of the work piece; feeding the plastic material to the peripheral surface of the roller by rotating the roller by the rotating machine; moving the roller along one side of the work piece, while allowing the peripheral surface of the roller to approach one side of the work piece, and at the same time, rotating the roller by the rotating machine in a somersaulting direction to a moving direction to which the roller moves; and pressing a squeegee supported along the peripheral surface of the roller by approaching or contacting the roller to one side of the work piece.

Further, the present invention relates to a production method of electronic parts for pressing and filling the plastic material into the work piece horizontally positioned, and is characterized by including the steps of: positioning the work piece having one side in a horizontal position with one side directed upward; overlaying a perforated plate having a through hole pattern passable by the plastic material on one side of the work piece; allowing a roller connected to a rotating machine to wait in a horizontal position in the vicinity of the perforated plate; feeding the plastic material to the peripheral surface of the roller by rotating the roller by the rotating machine; moving the roller along the upper surface of the perforated plate, while allowing the peripheral surface of the roller to approach the upper surface of the perforated plate, and at the same time, rotating the roller by the rotating machine in a somersaulting direction to a moving direction to which the roller moves; and pressing a squeegee supported along the peripheral surface of the roller by approaching or contacting the roller to the perforated plate.

Further, the present invention relates to a production method of the electronic parts for pressing and filling a plastic material into a work piece horizontally positioned, and is characterized by including the steps of: positioning the work piece having one side in a horizontal position with one side directed upward; allowing a roller packaging the rotating machine for rotating a rotor around a stator to wait in a horizontal position in the vicinity of the work piece; feeding the plastic material to the peripheral surface of the roller by rotating the roller by the rotating machine; returning an excessive plastic material to the peripheral surface of the roller and making a strong de-gassing possible if in the vacuum, and moving the roller along one side of the work piece, while allowing the peripheral surface of the roller to approach one side of the work piece, and at the same time, rotating the roller by the rotating machine in a somersaulting direction to a moving direction to which the roller moves; and pressing the squeegee rotatably supported along the peripheral surface of the roller by approaching the roller to one side of the work piece by a reactive force of the torque by which the rotating machine rotates the roller.

Further, the present invention relates to the production method of electronic parts for pressing and filling a plastic material into a work piece horizontally positioned, and is characterized by including the steps of: positioning the work piece having one side in a horizontal position with one side directed upward; overlaying a perforated plate having a through hole pattern passable by said plastic material on one side of said work piece; allowing a roller packaging a rotating machine in which a rotor rotates around a stator to wait in a horizontal position in the vicinity of said perforated plate; feeding said plastic material to the peripheral surface of said roller by rotating said roller by said rotating machine (the plastic material of the roller periphery can be strongly air-released when in the vacuum); moving said roller along the upper surface of said perforated plate, while allowing the peripheral surface of said roller to approach the upper surface of said perforated plate, and at the same time, rotating said roller by said rotating machine in a somersaulting direction to a moving direction to which said roller moves; and pressing a squeegee rotatably supported along the peripheral surface of said roller by approaching or contacting said roller to said perforated plate by the reactive force of the torque by which the rotating machine rotates the roller.

Further, the production method of electronic parts according to the present invention is characterized by including a step of positioning the work piece in the atmospheric pressure. The production method is characterized by including a step of positioning the work piece in the vacuum. In this case, an excessive plastic material may adhere to the roller and circulate while being exposed in the vacuum so as to allow a strong de-gassing to be performed. Alternatively, the production method is characterized by continuously combining a step of positioning the work piece in the atmospheric pressure and a step of positioning the work piece in the vacuum.

Further, the production method of electronic parts according to the present invention is characterized by including the steps of: allowing the lower surface of a perforated plate to approach a work piece by overlaying the perforated plate having a through hole pattern to penetrate the upper surface and the lower surface on the work piece positioned in a horizontal position; pressing and filling the plastic material into the work piece by pressure-feeding the plastic material to the through hole pattern of the perforated plate; and generating a differential pressure with the perforated plate spaced apart so that the air pressure of the upper surface side of the perforated plate becomes higher than that of the lower surface side.

Further, the production method of electronic parts according to the present invention is characterized by including the steps of: positioning a work piece in a horizontal position on an alignment table capable of adjusting its height; supporting in a horizontal position a perforated plate having a through hole pattern to penetrate the upper surface and the lower surface above the work piece positioned on the alignment table; allowing the lower surface of the perforated plate to approach the work piece by performing the adjustment of the height of the alignment table; pressing and filling the plastic material into the work piece by pressure-feeding the plastic material to the through hole pattern of the perforated plate; and generating a differential pressure with the perforated plate spaced apart so that the air pressure of the lower surface side of the perforated plate becomes higher than that of the upper surface side.

Further, the production method of electronic parts according to the present invention is characterized by including a step of isolating the work piece below the perforated plate by performing the adjustment of the height of the alignment table. Further, the production method is characterized in that either of the air pressure of the upper surface side of the perforated plate or the air pressure of the lower surface side is set to the atmospheric pressure or the vacuum pressure. Further, the plastic material is characterized by being a resin to insulate-encapsulate the work piece. The plastic material is characterized by being a solder paste which forms a solder bump. Alternatively, the plastic material is characterized by being a conductive paste or a non-conductive paste for hole-plugging wafer and resin substrates, and a through hole is laminated with an adhesive film at its rear surface so as to be blinded, and the holes of identical or different diameters are vacuum-filled at one time, and a plug is formed in a convex shape and cured or semi-cured, and the film of the rear surface is peeled off.

Further, the production method of electronic parts according to the present invention is characterized in that the plastic material is a conductive paste or a non-conductive paste for hole-plugging the wafer or resin substrate, and comprises the steps of pressing and filling said plastic material in a vacuum; and after curing of said plastic material, filling said plastic material in a vacuum or atmospheric pressure or further filling the plastic material in atmospheric pressure after performing the vacuum-filling.

According to the printing device and production method of electronic parts of the present invention, the following advantages can be achieved. That is, while rotating a roller by a rotating machine, a plastic material is fed to the peripheral surface of the roller, and while rotating the roller, when the roller is linearly moved along one side of a circuit board and a surface mount (hereinafter referred to as "work piece"), the plastic material adheres to the peripheral surface of the roller and is pressed between the roller and the work piece. In the meantime, when the roller rotates and is in the midst of moving along one side of the work piece, a squeegee is pressed to one side of the work piece. In this state, the plastic material pressed between the roller and the work piece is regulated by the squeegee, which has an angle and a length suitable for filling by escaping backward from the moving direction of the roller. At the same time, the resin between the roller and the squeegee is sealed.

Consequently, the resin is fed between the roller and the work piece by the autorotation and movement of the roller, and while being strongly pressurized by the combined force of the filling force of the squeegee and the filling force by the roller, the plastic material is directly pressed and filled into a masked substrate and a non-masked substrate, and by the adjustment of the angle and contact length of the squeegee and the rotational speed and moving velocity of the roller, the filling force is optimized to meet the purpose, and the pressure at the squeegee top end is controlled so that the printing can be performed in a flat shape or convex shape without being affected by the shape and area of the substrate. When the filling force is zero at the top end of the squeegee, the resin is cut off in a flat shape, and when the filling force is positive, the printing is performed in a convex shape (see FIG. 2). This is an excellent invention of the basic elementary technology, which fills and prints the member having a clearance gap.

Further, when some clearance gaps are provided between the squeegee and the roller, an excessive resin circulates around the roller. By utilizing this fact, for example, when the plastic material is combined with the vacuum, it adheres on the surface of the roller and circulates so as to be exposed to the vacuum, so that the plastic material completely de-gassed (see reference numeral 235 of FIG. 11) is fed and can achieve voidlessness higher than a conventional vacuum differential pressure method. When the squeegee printing pressure, the roller rotation, and the moving velocity are singly driven and adjusted, respectively, the plastic material can be optimized and easily adapted for a wide variety of applications.

Further, to miniaturize to the extreme limit and simplify the device, the squeegee receives a reactive force by which the roller is rotated and driven, and at the same time, when the printing device is constituted such that the rotation of the rotor is transmitted to the support shaft, while being reduced by the speed reducer, the following advantage can be achieved. That is, according to the viscosity of the plastic material and the like, the adjustment of the above described reactive force, in other words, the adjustment alone of the load applied to the roller can increase or decrease the force by which the squeegee is pressed into the work piece. Further, the pinion coupled to the end portion of the roller is engaged with a rack which is laid down at the lateral side of the work piece and extended in a moving direction, and the roller is rotated by the rotating machine, and therefore, the device in its entirety can be miniaturized to the extreme limit. As for the control thereof, since there are only a forward rotation, a reverse rotation, and a stop, the operation is easy and simple, and whatever is the process, it can be promptly realized.

Consequently, in case the device is arranged in the vacuum by attempting to completely remove the void from the plastic material, the volume of the sealed chambers, for example, forming such vacuum can be sharply reduced, and without using the actuator of an air equipment and the like or an air cleaner, the miniaturization of a vacuum pump and the like for vacuuming the sealed chambers can be attempted, and the degree of density of the sealed chambers can be lowered, and the weight thereof can be made light, and moreover, a tact time can be reduced, thereby improving the productivity. Alternatively, in case the bracket which rotatably supports the roller is constituted in such a way as to be moved to a moving direction by a driving source provided outside of the roller, there is an advantage of being able to freely adjust a feeding amount of the plastic material, but the device becomes complicated a little.

Further, in case the above described roller comprises an inner casing to house a rotating machine and a cylindrical outer casing arranged by providing a clearance gap with the periphery of the inner casing, when the rotor of the rotating machine is rotated, the inner casing rotates together with the periphery of the cylindrical outer casing. The rotational directions of these casings match a somersaulting direction to a moving direction to which the roller in its entirety moves along the upper surface of the perforated plate.

Further, by providing a clearance gap between the inner casing and the cylindrical outer casing of the roller, a heat generated by the rotating machine is prevented from conducting to the plastic material having adhered on the peripheral surface of the roller, and the viscosity of the plastic material can be controlled not to be changed by the influence of the temperature. Further, the flanges of both ends which support the inner casing and the cylindrical outer casing of the roller are provided with through holes, and when they are applied to a vacuum printing coater and a vacuum printing machine that constitute part of the present invention, the vacuuming is repeated, so that the rotating machine can be positively cooled, and the viscosity of thermoplastic material can be reliably stabilized. Further, to execute a forced cooling, the support shafts of both ends are made hollow and communicates with the vacuum pump. Further, the roller is always in contact with the resin, and is in a state of being polished by the squeegee and thus it becomes consumable. Hence, the cylindrical outer casing is required to be easily replaceable. Even for that reason, the cylindrical outer casing is effective.

Further, according to the printing device of electronic parts of the present invention, even when the perforated plate having a through hole pattern allowing the plastic material to pass through is overlaid on one side of the work piece, the above described advantage can be displayed, and therefore, a precision encapsulation, which is still further voidless and higher in flatness than the conventional vacuum differential pressure printing of the substrate surface-mounting the electronic parts such as CSP, BGA and the like, is possible because of the de-gassing effect and the filling force strengthening effect by the rotation of the roller.

Further, according to the printing device and method of electronic parts of the present invention, to overlay the perforated plate having a through hole pattern penetrating the upper surface and the lower surface on the work piece to be positioned in a horizontal position, and allow the work piece to approach the lower surface of the perforated plate so as to be voidless, the upper part and lower part sealed chambers are vacuumed, and the plastic material is pressed and filled into the work piece through the through hole pattern of the perforated plate by the above described method, and by the combination of the operations of two leak valves and a stop valve, since the inflow of the atmospheric air into the upper part sealed chamber and the lower part sealed chamber can be individually allowed or sealed, the individual leak valve and the stop valve are operated so that the differential pressure is generated with the perforated plate spaced apart in such a manner that the air pressure of the upper surface side of the perforated plate becomes higher than that of the lower surface side.

In this way, since the plastic material is pushed downward from the through hole pattern of the perforated plate, the plastic material can be satisfactorily transferred on the work piece. When this is applied to a bump formation, the solder paste filled into the through hole of a high aspect ratio is transferred by adhesive force and differential pressure, and a narrow pitched high precision bump can be formed.

Alternatively, by horizontally supporting the perforated plate having a through hole pattern penetrating the upper surface and the lower surface above the work piece positioned in a horizontal position on the alignment table as described above, and by adjusting the height of the alignment table, the lower surface of the perforated plate is allowed to approach the work piece, and the plastic material is fed so as to activate the vacuum pump, and the upper part sealed chamber and the lower part sealed chamber are vacuumed so as to put the upper part sealed chamber and the lower part sealed chamber into a vacuumed state, thereby the plastic material can be pressed and filled into the work piece through the through hole pattern of the perforated plate by the above described method. Further, the individual leak valve and the stop valve are operated so that the differential pressure is generated with the perforated plate spaced apart in such a manner that the air pressure of the lower surface side of the perforated plate becomes higher than that of the upper surface side.

In this way, since a little air of the lower part sealed chamber tries to pass through upward between the plastic material and the peripheral surface of the through hole pattern, the plastic material is satisfactorily cut from a peripheral edge of the through hole pattern, and at the same time, the air pushes back the plastic material in the vicinity into interior, and the lowering of the viscosity in the midst of curing prevents an outflow of the plastic material to the vicinity. This is mainly applied to a resin encapsulation, and is an innovative method capable of achieving a precision-shape.

Particularly, in case the rigidity of the perforated plate is high and the inflow of the air between the perforated plate and the work piece is prevented, by adjusting the height of the alignment table, the work piece may be isolated below the perforated plate. In this way, since the clearance gap between the work piece and the perforated plate can be positively widened, the air of the lower part sealed chamber can easily pass through between both of them, and thus the above described advantage can be achieved regardless of a quality of the material of the perforated plate, thickness and the like. Further, when at least either of the air pressure of the upper surface side of the perforated plate or the air pressure of the lower surface side is set to the atmospheric pressure or the vacuum pressure, it can be applied to the atmospheric printing method.

Further, in case the above described vacuum printing coater is used for encapsulation, the combined force of filling forces of the squeegee and the roller starts operating, and the resin is strongly filled into a convexo-concave and a multi-wire by an extremely complicated shape, and a residual air is compressed and pushed out from the work, the substrate, and the wall surface of a chip. After that, the resin is restored to the atmospheric pressure, and is impregnated allover the place by the differential pressure, and the surface has a resin pressure set to almost zero at the top end of the squeegee, and is cut in flatness and is printed. Although a conventional vacuum printing machine feeds the resin by the squeegee so as to cover the machine, and the resin is filled by the vacuum differential pressure, and a finish printing is performed in the vacuum, when a differential pressure is applied in a state in which the top portion of the wire is thinly covered with the resin, there arises a problem that a non-resin filled portion and the pressure of the outside are short-circuited and a filling of the resin becomes impossible or a residual air quantity becomes microvoid and inevitably remains as it is.

Further, in case the resin is used for the hole-plugging of the substrate, to plug the through hole, an adhesive film is laminated on the rear surface of the substrate, and blinded vias are formed there, and by using the vacuum printing coater without a mask, a resin filling printing is performed in the vacuum, and the blinded vias are impregnated with the atmospheric pressure, and further, when the filling force is set to a positive side by the squeegee top end, and a printing is made, a plug (convex printing) is formed on the upper surface, and the lower part is filled at the same surface level as the substrate. This plug is semi-cured or cured, and the film is removed. This method makes it possible to simultaneously fill the holes of different diameters, and does not require the mask or the positioning thereof, thereby sharply simplifying a polishing step. Although the conventional device has been a plant, it is now simplified, and an innovative hole-plugging method is achieved. Further, when the work which is high in aspect ratio is filled at one time and then cured, and after that, when it is filled and cured again, a perfect hole-plugging can be performed without any filling mistake. Further, a direct printing has an advantage in that, even when there exists non-filled portion, it can be filled again, and no imperfect product comes out.

Further, in case this is applied to the bump formation, the via necessary for the bump formation is formed on the substrate by the resist, and it is filled without a mask in vacuum by the printing coater, and is restored to the atmospheric pressure and impregnated therewith, and the filling pressure at the squeegee top end is set to almost zero and the via is cut in flatness and reflows, thereby separating the resist so as to achieve the bump formation. In an experimental production, a bump of 60 µ was formed by a solder paste having particles of a size of 10 µ by SnAgCu, and it was easily formed with a margin of error equal to or less than 1 µ.

BRIEF DESCRIPTION OF THE DRAWINGS

FIG. 2(A) is a conceptual illustration to explain one example of the operation of the printing device of electronic parts according to the embodiments of the present invention;

FIG. 2(B) is a graph plotting its pressure as a filling force in ordinate and plotting distances corresponding to respective positions of a roller and a squeegee in abscissas; FIG. 2(C) is a conceptual illustration to explain another example of the operation; and FIG. 2(D) is a graph plotting its pressure as a filling force in ordinate, and plotting the distances corresponding to respective positions of the roller and the squeegee in abscissas;

FIG. 3 is a partially broken front view of the printing device of electronic parts of a first embodiment of the present invention;

FIG. 5 is a conceptual illustration to show main components of the printing device of electronic parts of the first embodiment of the present invention;

FIG. 7 is a front view of the main components of the production unit of electronic parts of the second embodiment of the present invention;

FIG. 10 is a conceptual illustration to show a process of a production method of electronic parts of a third embodiment of the present invention;

FIG. 13 is a conceptual illustration to show a process of the production method of electronic parts of a fourth embodiment of the present invention;

BEST MODE FOR CARRYING OUT THE INVENTION

Based on FIGS. 1 to 5, a printing device E1 of electronic parts which presses and fills an adequate amount of plastic materials into a work piece 2 with its one side 21 directed upward and overlaid with a perforated plate 1 will be described below with a printing head as an example. Further, the directions indicated by arrow marks X, Y, and Z, respectively correspond to the following shaft direction, moving direction and height direction, respectively. With respect to self-evident mechanical components such as a bolt, a nut, a key, a key slot, a bearing and the like, the description as well as illustration thereof will be omitted. A control equipment for controlling the operation of the printing device E1, a sensor for detecting the operation and stop, and the like will be also similarly omitted.

Figure 1:
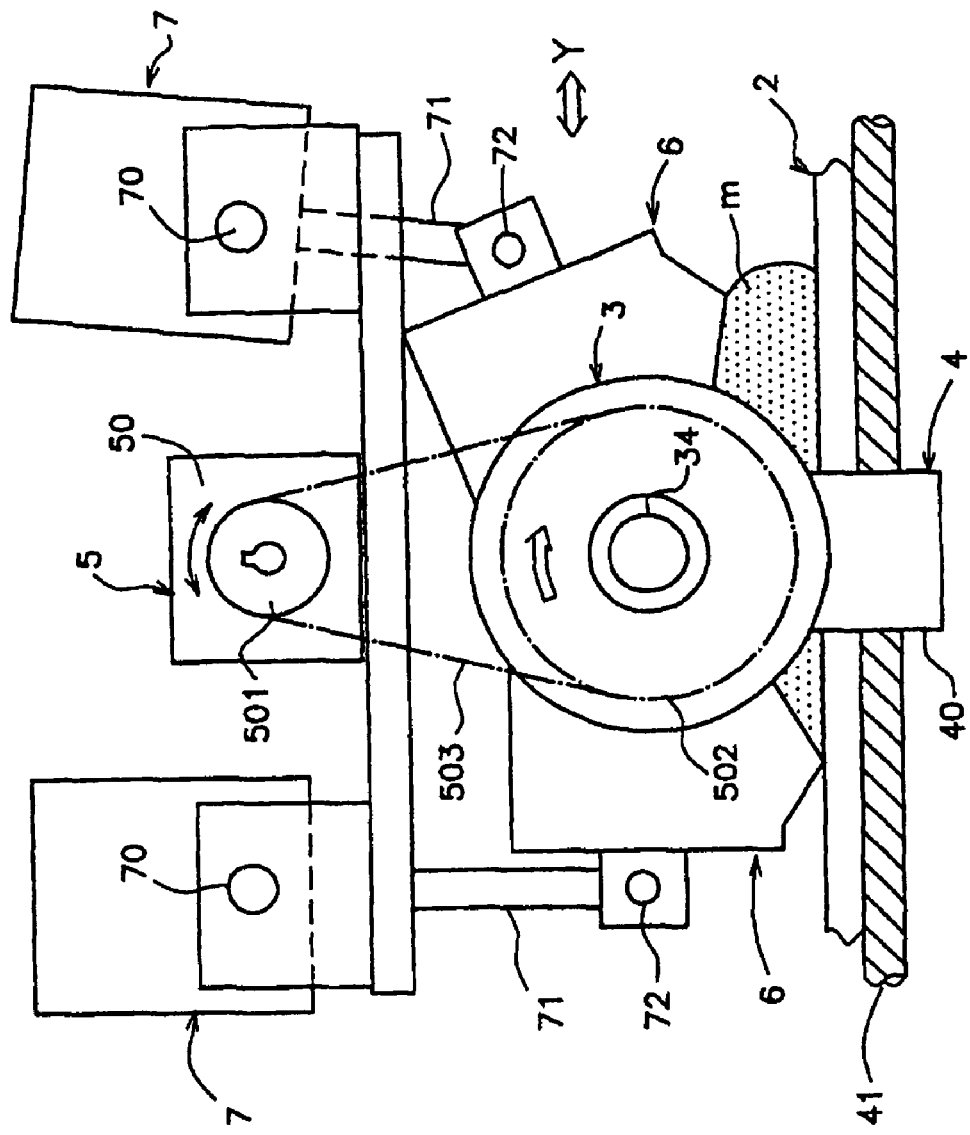
FIG. 1 is a conceptual illustration to explain a principle of a printing device of electronic parts according to embodiments of the present invention.

First, a principle of a printing head of the printing device E1 will be described. FIG. 1 shows a roller 3 which allows its peripheral surface to approach one side 21 of the work piece 2, moving means 4 for allowing the roller 3 to move in a direction indicated by the arrow mark Y along one side 21 of the work piece 2, rotating means 5 for allowing the roller 3 to rotate in a direction somersaulting to a moving direction to which the roller 3 is moved by the moving means 4, and a squeegee 6 pressed to one side 21 of the work piece 2 by approaching or contacting the roller 3.

As for the moving means 4, such means may be applied in which a ball nut 40 is attached to a bracket (not shown) which supports the roller 3, while a feed screw 41 screwed to the ball nut 40 is rotated by a driving source such as a motor and the like arranged outside of the roller 3, thereby moving the roller 3. As for the rotating means 5, such means may be applied in which a timing pulley 501 is attached to an output shaft of a rotating machine 50 arranged outside of the roller 3, and a timing pulley 502 is attached to the support shaft 34 of the roller 3, and the rotating force of the output shaft of the rotating machine 50 is transmitted to the roller 3 through the timing belt 503, which is wound around the timing pulleys 501 and 502.

The squeegee 6 may be supported by a support body not illustrated in the drawing which can rotate along the peripheral surface of the roller 3, and for example, may be moderately pressed to one side 21 of the work piece 2, for example, by printing pressure generating means 7 mainly composed of an actuator such as an air cylinder and the like. The printing pressure generating means 7 is rotatably attached to a hinged joint 70 in the vicinity of the roller 3 so as to be set in a standing posture or in an inclined posture, and its operating rod 71 is rotatably connected to the squeegee 6 through a hinged joint 72.

Further, a pair of squeegees 6 as shown in FIG. 1 has the one squeegee pressed to one side 21 of the work piece 2 by the printing pressure generating means 7, and the other squeegee floated from one side 21 of the work piece 2. This intends that, while an adequate amount of plastic material m is accumulated in the lower side of the squeegee 6 positioned ahead of the moving direction Y of the roller 3, the plastic material m is gradually pulled into the lower side of the roller 3 accompanied by its rotation, and moreover, is compressed by the squeegee 6 which is positioned backward of the moving direction Y of the roller 3.

Describing more in detail, as shown in FIGS. 2(A) and 2(B), the plastic material m fed so as to adhere on the peripheral surface of the roller 3 is gradually pulled into the lower side of the roller 3 as the roller 3 moves while rotating, and is compressed between one side 21 of the work piece 2 and the roller 3. The pressure applied to the plastic material m at this time reaches a peak at a position P1 at which the plastic material m passes through directly below the roller 3. After that, though the pressure drops down before reaching a contact point P2 at which the squeegee 6 contacts one side 21 of the work piece 2, the pressure is set such that a desired pressure can be still maintained even at the contact point P2. In this way, in case the hole-plugging of the via or the through hole of the work piece 2 (for example, printed circuit board or wafer substrate) is to be performed, since an adequate pressure can be accumulated in the plastic material m which is plugged into the via or the through hole, as shown in the drawing, after the squeegee 6 passes through, the plastic material m swells up in a convex shape from the via or the through hole.

Alternatively, as shown in FIGS. 2(C) and 2(D), the plastic material m fed so as to adhere on the peripheral surface of the roller 3 is compressed between one side 21 of the work piece 2 and the roller 3 as already described. Although the pressure applied to the plastic material m reaches a peak at a position P3 at which the plastic material m passes directly below the roller 3, after that, the pressure is set so as to become zero before reaching a contact point P4. In this way, since the pressure does not remain in the plastic material m which is filled into a concave place of one side 21 of the work piece 2, as shown in the drawing, even after the passage of the squeegee 6, the plastic material m holds a flat shape To be suitable for a variety of applications, it is preferable that the rotation and movement of the roller 3, and the above described pressure are adjustable independently. The best mode for the embodiments of the above described principle will be described below in detail.

FIRST EMBODIMENT

Figure 4A:
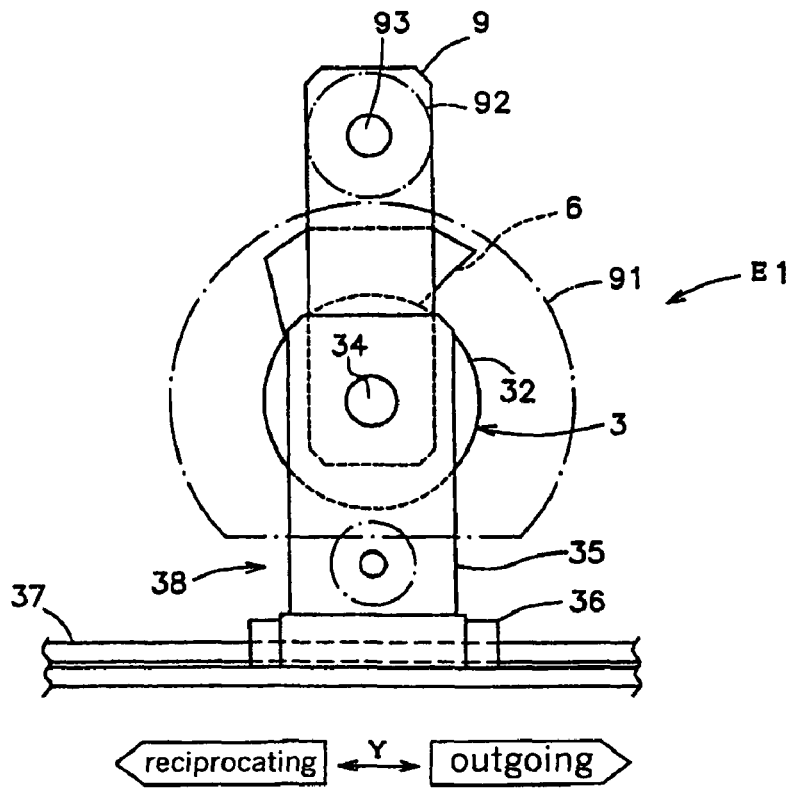
FIG. 4(A) is a side view of the printing device of electronic parts of the first embodiment of the present invention.
Figure 4B:
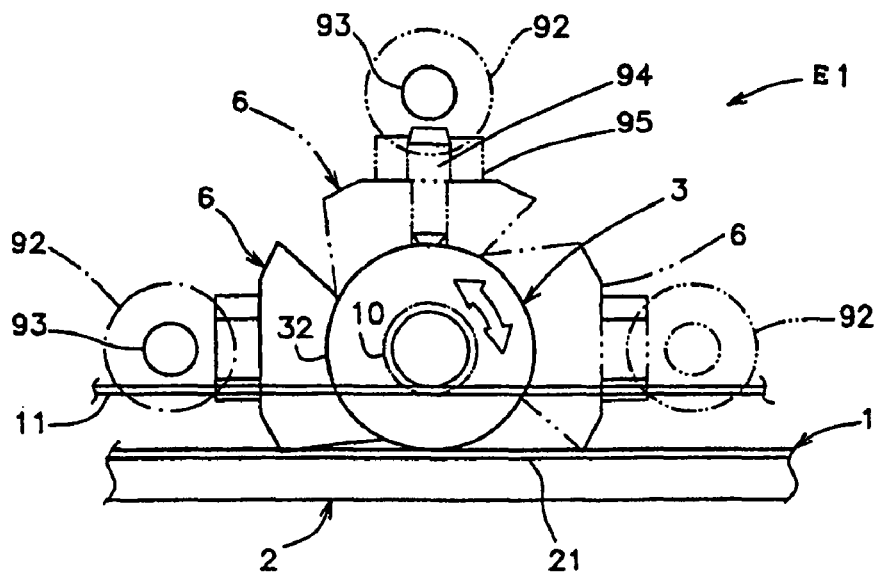
FIG. 4(B) is a sectional view cut along the line A-A of FIG. 3.

FIG. 3 is a front view of a printing device E1. FIG. 4(A) is a side view of the printing device E1, and FIG. 4(B) is a sectional view cut along the line A-A of FIG. 3. FIG. 5 shows a conceptual structure of main components of the printing device E1. As shown in these drawings, the printing device E1 comprises: a circuit board positioned in a horizontal position; a roller 3 of which both end portions 31 in a shaft direction X are supported, respectively, in the vicinity of both sides of the work piece 2 (hereinafter referred to as "circuit board 2"), and which allows a peripheral surface 32 to approach one side of the circuit board 2 via a perforated plate 1; moving means 4 for allowing the roller 3 to move in direction Y along one side 21 of the circuit board 2; rotating means 5 for allowing the roller 3 to rotate while the moving means 4 is on the way to moving the roller 3; a squeegee 6 rotatably supported along the peripheral surface 32 of the roller 3 for approaching the roller 3; and printing pressure generating means 7 for pressing the squeegee 6 against the perforated plate 1 overlaid on one side 21 of the circuit board 2 by a reactive force of the torque by which the rotating means 5 rotates the roller 3.

The moving means 4 and the rotating means 5 share a rotating machine 50 packaged inside the roller 3 as a driving source thereof. The details are as follows. That is, the moving means 4 consists of a pair of pinions 10 coupled to both end portions 31 of the roller 3, a pair of racks 11 arranged so as to nip the circuit board 2 from both sides thereof and fixed to a basement and the like not shown in the drawing, and the above described rotating machine 50. The pair of racks 11 extend along the moving direction Y in parallel with each other, and each rack engages with the pinions 10, respectively. In this state, the peripheral surface 32 of the roller 3 slightly floats from the perforated plate 1, and an adequate clearance gap is kept between the perforated plate 1 and the roller 3. The rotating machine 50 has its stator 51 and rotor 52 relatively rotatable, and the rotor 52 is rotated and driven in the inner side of the cylindrical stator 51, which extends in the shaft direction X.

When the rotor 52 is rotated and driven as described above, Accompanied by this, the pinion 10 rotates together with the roller 3. The reactive forces of the rotations of the roller 3 and the pinion 10 are transmitted to the printing pressure generating means 7, and the printing pressure generating means 7 presses the squeegee 6 to the perforated plate 1, thereby balancing the forces. This principle will be described later. When the pinion 10 rotates, the roller 3 in its entirety moves to the right side or the left side (hereinafter referred to as "outgoing" or "reciprocating") in the drawing along the moving direction Y. At the same time, the roller 3 rotates in a somersaulting direction for the outgoing or the reciprocating direction initiated by itself.

That is, the roller 3, when outgoing, rotates clockwise in FIG. 4, and when reciprocating, rotates counterclockwise. A velocity (peripheral velocity) of the peripheral surface 32 of the roller 3 which "somersaults" in this way is approximately decided by a ratio of the diameter of the peripheral surface 32 of the roller 3 to the pitch circle of the pinion 10. In the illustrated example, the peripheral velocity of the roller 3 is approximately set to 1.2 to 1.5 times the moving velocity moving in the arrow mark Y direction of the roller 3.

The rotating means 5 comprises a pair of support axes 34 which extend in the shaft direction X of the roller 3 and penetrate respective pinions 10, and allow respective top ends 33 to protrude outside the roller 3; a speed reducer 8 transmitting a torque generated in the rotor 52 of the rotating machine 50 to the one (the right side in FIG. 3) support shaft 34; and a pair of link members 9 extending from the vicinity of the respective top ends 33 of the pair of support axes 34 to the diameter direction of the roller 3. The pair of link members 9 support both ends of a squeegee support bar 95, respectively, which are supported by the center pin 94 of the squeegee 6, and the squeegee 6 can slightly swing with the pin 94 taken as a point of support. Further, the respective support axes 34 can freely rotate for the roller 3 and the individual pinion 10.

The vicinity of the respective top ends 33 of the pair of support axes 34 is journaled by a pair of support pieces 35, respectively. The pair of support pieces 35 are fixed by a pair of direct-acting guide bearings 36, respectively. Further, the pair of direct-acting guide bearings 36 are slidably engaged with a pair of guide rails 37, respectively, which extend in the moving direction Y. These members constitute a bracket 38, which slidably supports the roller 3 in the moving direction Y, and play a role of guiding the roller 3 on the straight so that the pinions 10 do not break away from the racks 11.

The printing pressure generating means 7 mounts a band brake 17 on one of the pair of support pieces 35, which adequately puts the brake on the rotation of the roller 3, in other words, applies a load to the roller 3. Since the speed reducer 8 and the band brake 17 are self-evident technologies, the detailed description thereof will be omitted, and the principle alone in which the printing pressure generating means 7 receives the above described reactive force will be described. The speed reducer 8 described below mainly consists of a sun gear directly connected to the rotor 52, a plurality of planetary gears arranged around this sun gear, and a casing housing the above described gears.

That is, when the rotating machine 50 is activated and the rotor 52 is rotated, this rotation is transmitted to the roller 3, while being reduced by the speed reducer 8. In this way, while the roller 3 is in the midst of making a forward rotation clockwise in FIG. 4, this reactive force is transmitted to the one support shaft 34 (the right side of FIG. 3) through the planetary gear, and a counterclockwise torque is generated in the support shaft 34. As a result, the squeegee 6 shown in FIG. 4(B) by a solid line is pressed to the perforated plate 1 overlaid on one side 21 of the circuit board 2. Alternatively, when the roller 3 is rotated counterclockwise in FIG. 4, as a reactive force of the rotation of the roller 3, a clockwise torque in reverse to the time when the rotor 52 makes a forward rotation is generated on the one support shaft 34. As a result, the squeegee 6 rotates clockwise together with the one link member 9. When the squeegee 6 reaches the right side position shown by a virtual line in the drawing, it hits against the perforated plate 1 and comes to rest.

In this way, every time the rotating machine 50 repeats the forward rotation and the reverse rotation, the squeegee 6 repeats the above described rotating operation. Further, by the frictional force obtained by applying a load to the roller 3 by the printing pressure generating means 7, in other words, by fastening either one of both the end portions 31 of the roller 3 by the band brake 17, the rotation of the roller 3 is given a resistance, so that the reactive force of the rotating machine 50 is positively increased, and a force (hereinafter referred to as "printing pressure") by which the squeegee 6 is pressed to one side 21 of the circuit board 2 can be adjusted as desired.

Although the above described operation of the squeegee 6 has been described with the one link member 9 only as a target, in reality, since the squeegee 6 has a long shape with a total length in the shaft direction X extending to more than 30 to 90 cm or more, to adjust the printing pressure to a practical strength, a uniform force has to be applied to both ends of the squeegee support bar 95 so that deflection and twist are not generated in the squeegee 6. Hence, a pair of link members 9 are desired to be mechanically connected.

For example, a pair of sector gears 91 are fixed to a pair of support pieces 35 of the bracket 38, respectively, and the planetary gears 92 engaged with the respective sector gears 91 are rotatably attached to suitable places of the respective link members 9, and an interdependent mechanical system constituted by connecting these pairs of planetary gears 92 by a connecting shaft 93 is added. In this way, the force which rotates the one link member 9 around the one support shaft 34 is changed to the torque which rotates the connecting shaft 93 by each gear 91 and 92 at the one link member 9 side, and the same torque is changed to a force which rotates the other link member 9 around the other support shaft 34 by each gear 91 and 92 of the other link member 9 side.

Further, though an example of packaging one piece of rotating machine 50 inside one piece of roller 3 has been illustrated, two rotating machines 50 and two speed reducers 8 connected to the respective rotors 52 may be packaged inside a piece of roller 3, and a pair of support shafts 34 may be driven independently. In this case, since the two rotating machines 50 can allow drive circuits for driving each set to be electrically synchronized, the above described interdependent mechanical system is not required. Further, an output may be taken out from both ends of the rotors 52 of the rotating machine 50, and both the ends of the rotors 52 may be connected to the speed reducers 8, individually, and these two sets of the speed reducers may be connected to a pair of support shafts 34.

Further, in case the moving means 4, as already described, is a device in which the bolt nut 40 is attached to the bracket 38, while the feed screw 41 screwed to the ball nut 40 is rotated by a driving source such as a motor and the like arranged outside of the roller 3, the above described pinion 10 and the rack 11 can be omitted. Further, since the perforated plate 1 is not an indispensable component when constituting and using the printing device E1, it may be omitted.

SECOND EMBODIMENT

Figure 6A:
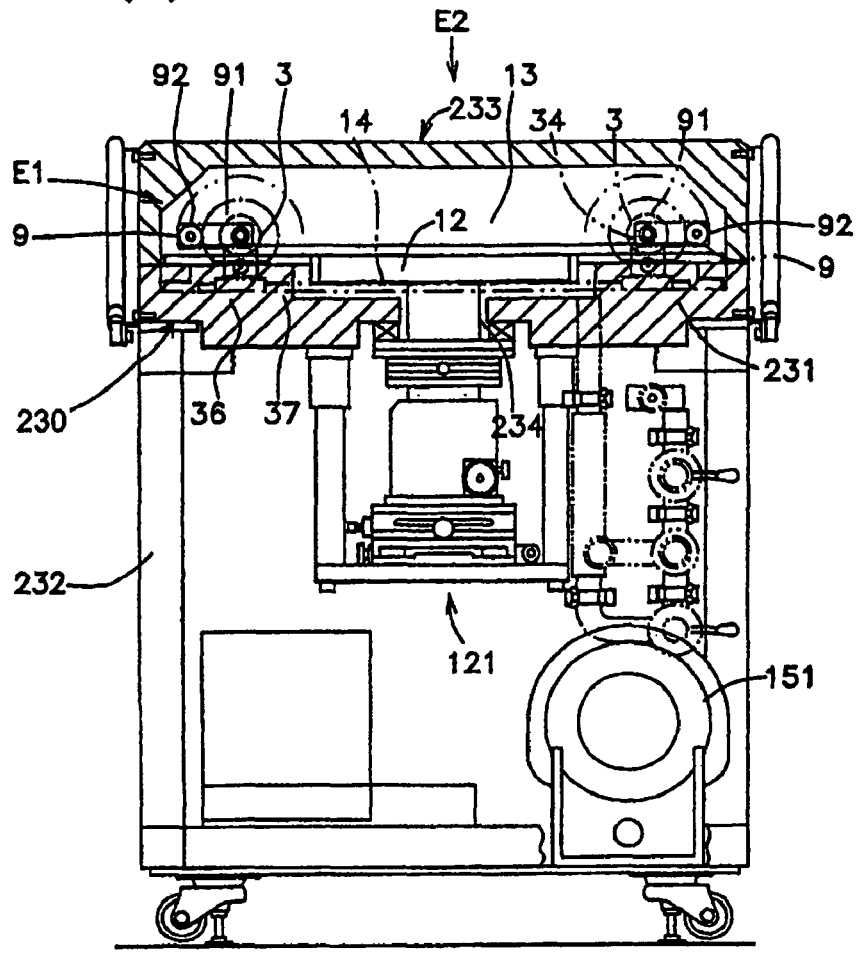
FIG. 6(A) is a front view of a production unit of electronic parts of a second embodiment of the present invention.
Figure 8:
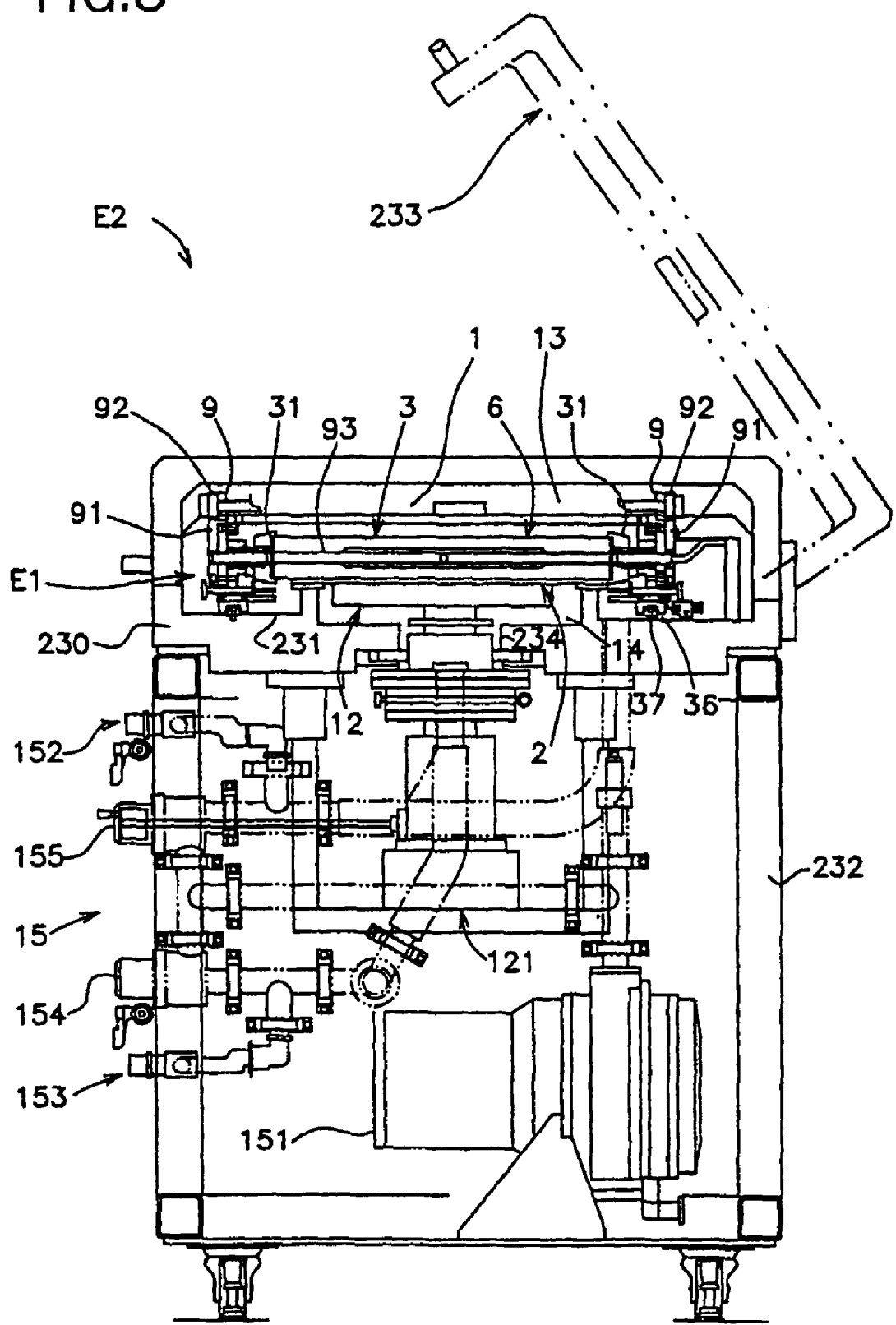
FIG. 8 is a side view of the production unit of electronic parts of the second embodiment of the present invention.
Figure 9:
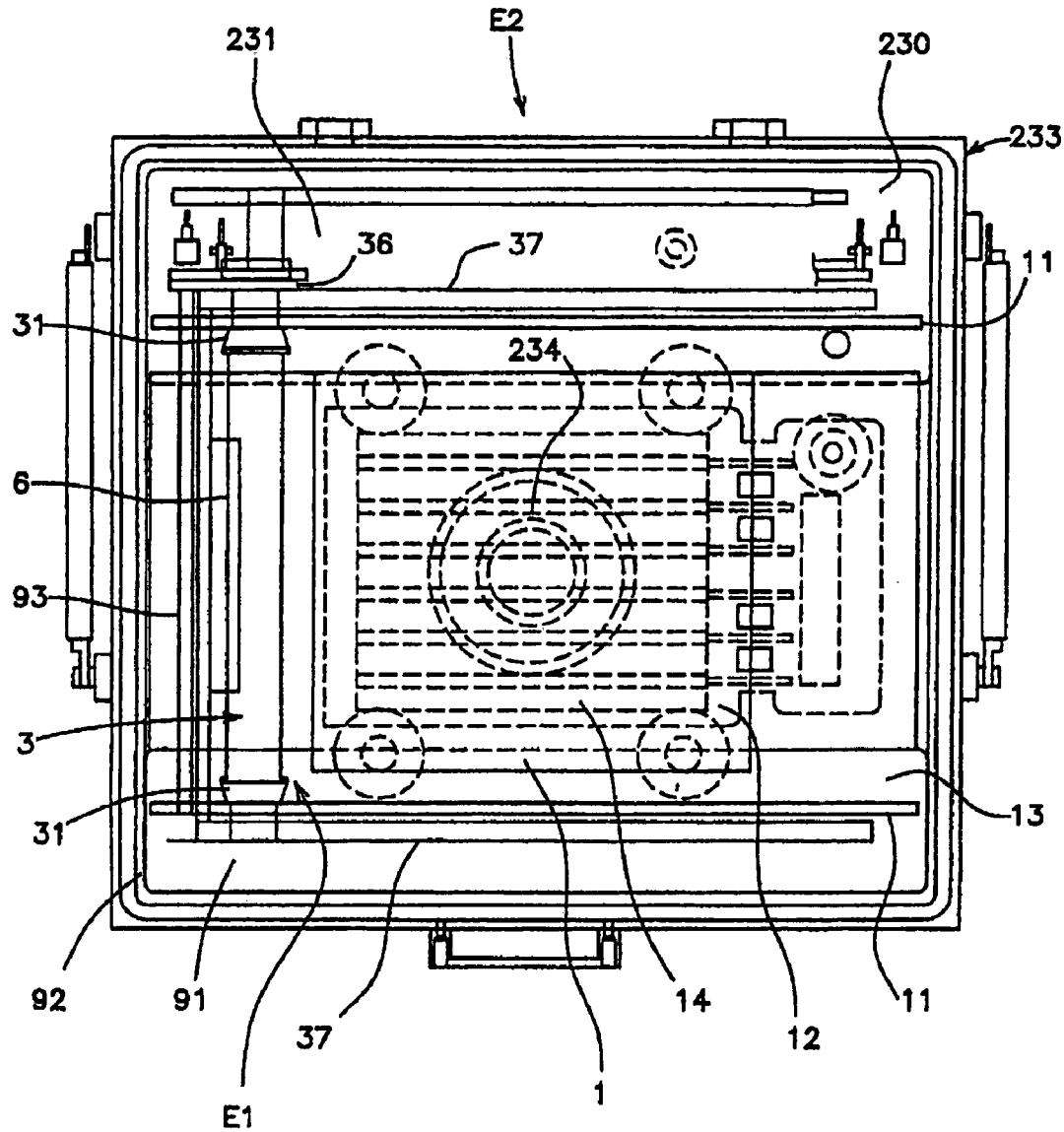
FIG. 9 is a top view of the production unit of electronic parts of the second embodiment of the present invention.

Next, based on FIGS. 6 to 9, a production unit E2 of electronic parts incorporating the above described printing device E1 (printing head) will be described. Further, the moving means 4 of the above described printing device E1 is not limited to a structure mainly consisting of the rotating machine 50 packaged inside the roller 3, but, as already described, the roller 3 may be moved by using the ball nut and the like which are rotated by the driving source provided outside of the roller 3. FIG. 6(A) is a front view of the production unit E2, and FIG. 7 is a front view of the main components thereof. FIGS. 8 and 9 are a side view and a top view of the production unit E2, respectively. As shown in these drawings, the production unit E2 comprises an upper part sealed chamber 13 housing the printing device E1 and the perforated plate 1; a lower part sealed chamber 14 housing an alignment table 12; and differential pressure generating means 15 to be described later.

The alignment table 12 can position a work piece 2 in a horizontal position with one side 21 of the work piece 2 directed upwardly. To be specific, the work piece 2 is slid in a horizontal position along a horizontal surface, and moreover, the work piece 2 is rotated still in a horizontal position. Further, the position of the work piece 2 thus positioned can be displaced to a vertical direction indicated by an arrow mark Z by the alignment table 12. Hereinafter, this will be referred to as height adjustment.

The upper part sealed chamber 13 forms a concave portion 231 and the lower part sealed chamber 14, wherein an upper surface of a basement 230 consisting of a square ingot made of aluminum or steel is engraved so that the printing device E1 and the perforated plate 1 are operable, and on the lower part sealed chamber 14, there is provided the perforated plate 1 (see FIG. 13) attached to a closable frame body 18. On the bottom surface of the concave portion 231, a pair of guide rails 37 are laid down, and at a position floated from the bottom surface, the pair of racks 11 are built. Further, on the bottom surface of the concave portion 231, there is formed an insertion hole 234, and the alignment table 12 within the lower part sealed chamber 14 is connected to an adjustment mechanism 121 arranged below the basement 230 through the insertion hole 234.

The adjustment mechanism 121, in addition to height adjustment of the alignment table 12, performs fine adjustment of the position of the alignment table 12 in a horizontal direction. The basement 230 is supported by a stand frame 232 housing the adjustment mechanism 121 and the differential pressure generating means 15 in its interior. The space between the alignment table 12 and the insertion hole 234 is sealed by an O ring and the like. On the basement 230, there is formed the upper part sealed chamber 13 to which a lid 233 made of acryl resin is closably attached. The lid 233 has a rigidity endurable even when a vacuum achievement in its interior reaches 50 Pas to 100 Pas.

The differential pressure generating means 15 generates a differential pressure between the upper part sealed chamber 13 and the lower part sealed chamber 14 with the upper part sealed chamber 13 and the lower part sealed chamber 14 in a state mutually spaced apart by the perforated plate 1 to be described later. For example, the differential pressure generating means 15 comprises: a vacuum pump 151 connected to both of the upper part sealed chamber 13 and the lower part sealed chamber 14; and two leak valves 152 and 153 connected to the upper part sealed chamber 13 and the lower part sealed chamber 14, respectively. Further, among the upper part sealed chamber 13, the lower part sealed chamber 14, and the vacuum pump 151, as shown in the pipe arrangement distribution diagram of FIG. 6(B), the upper part sealed chamber 13 is provided with the leak valve 152 and a stop valve 155, and the lower part sealed chamber 14 is connected to the leak valve 153 and a stop valve 154, and by combining the operations of these valves, the upper part sealed chamber 13 and/or the lower part sealed chamber 14 can freely generate a vacuum, thereby a cutting or dispensing of the plastic material can be performed.

THIRD EMBODIMENT

Next, the production method of electronic parts which allows an adequate amount of plastic materials to be pressed and filled into a circuit board 2 positioned in the above described alignment table 12 will be described. Further, the plastic material, which can be handled in this method, includes at least a liquid resin such as epoxy resin and the like mixed with a filler (for encapsulation), a conductive paste having a percentage content of copper or silver of 80 percent or more with epoxy resin as a binder/a non-conductive paste mixed with a filler such as copper, silica gel or the like in epoxy resin (for hole-plugging), a solder paste (for bump formation), and polyimide resin/liquid resist (for insulating a work piece).

Figure 11A:
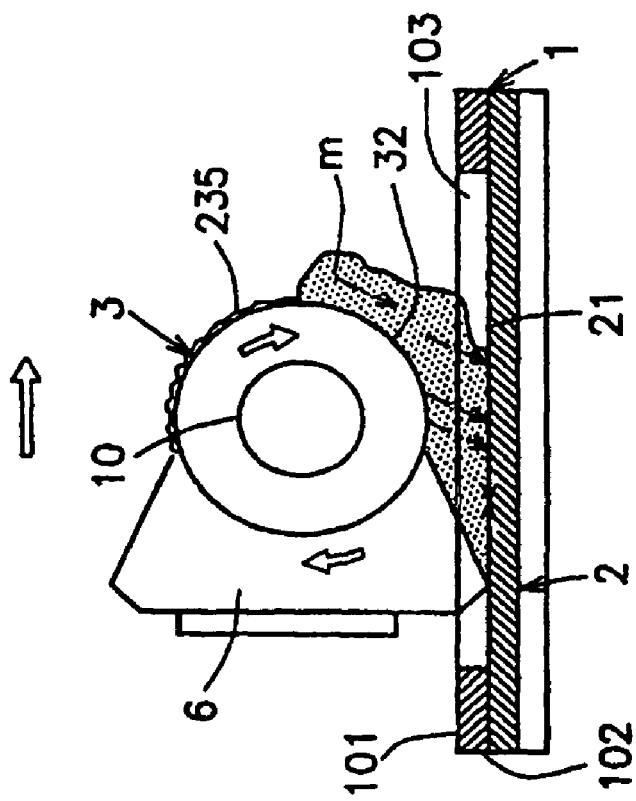
FIG. 11(A) is a conceptual illustration to show a principle of the production method of electronic parts of the third embodiment of the present invention.
Figure 11B:
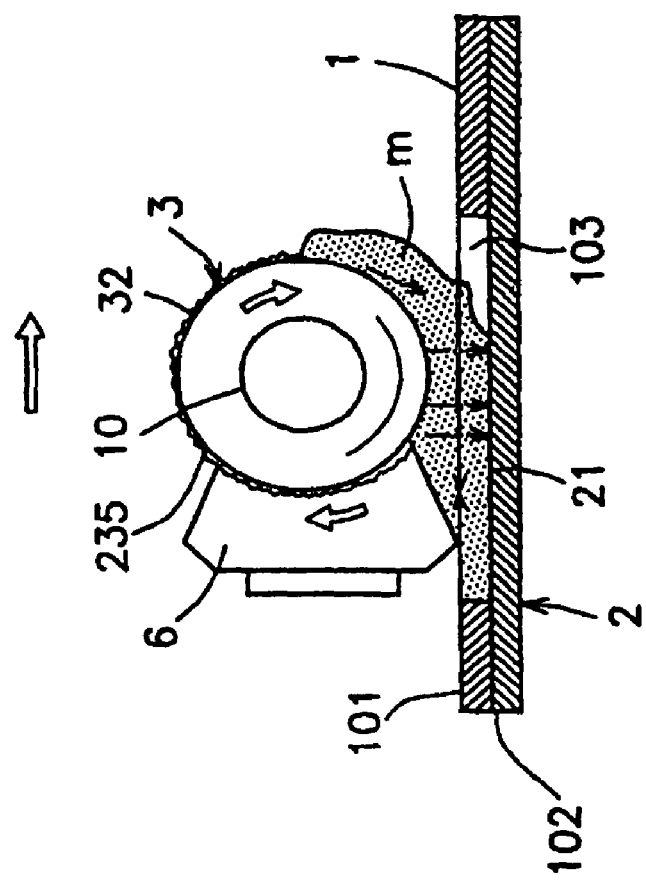
FIG. 11(B) is a conceptual illustration to show another example.

First, as shown in FIGS. 10 and 11, the circuit board 2 is positioned on the alignment table 12. The positioning of the circuit board 2 is performed by a positioning pin not shown in the drawing provided in the alignment table 12. In this state, whether or not the atmosphere into which the circuit board 2 is placed is an atmospheric pressure or a vacuum is not particularly questioned. Further, the perforated plate 1 may be overlaid on the circuit board 2. Although the perforated plate 1 is not required in case an appropriate place of one side 21 of the circuit board 2 is laminated (covered) in advance by a film and the like, hereinafter, an example adopting the perforated plate 1 having a through hole (opening portion) pattern 103 which penetrates one side 101 and the other side 102 will be described.

Subsequently, the roller 3, for example, as shown in FIG. 9, is allowed to wait in the vicinity of the perforated plate 1. In this state, as shown in FIG. 11(A), the peripheral surface 32 of the roller 3 or one side 101 of the perforated plate 1 is fed with a plastic material m. While the peripheral surface 32 of the roller 3 approaches to one side 101 of the perforated plate 1, the roller 3 is allowed to reciprocate along one side 101 of the perforated plate 1, and at the same time, the roller 3 is rotated by the rotating machine 50 in a somersaulting direction to a moving direction Y to which the roller 3 moves. In this way, the plastic material m having adhered to the peripheral surface 32 of the roller 3 is pressed into a space between the outgoing roller 3 and the perforated plate 1.

Figure 12A:
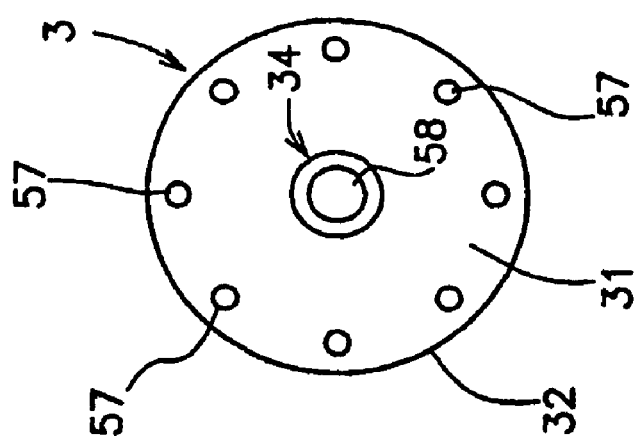
FIG. 12(A) is a sectional view to show a modification of a roller applied to the production method of electronic parts of the third embodiment of the present invention.

In this process, when the heat generated by the rotating machine 50 packaged inside the roller 3 is conducted to the plastic material m having adhered to the peripheral surface 32 of the roller 3, there arises an inconvenience that the viscosity of the plastic material m receives temperature effects and changes. Hence, as shown in FIG. 12(A), the roller 3 may have a double structure comprising an inner casing 53 housing a rotor 52 (omitted in the drawing) of the rotating machine 50 and a cylindrical outer casing 55 arranged by providing a clearance gap 54 of approximate by 2 mm around the inner casing 53. In this way, the heat generated by the rotating machine 50 is prevented from being conducted to the plastic material m through the peripheral surface 32 of the roller 3. Further, when the rotor 52 of the rotating machine 50 is rotated, the cylindrical outer casing 55 rotates together with the inner casing 53. This rotational direction is a somersaulting direction for the moving direction to which the roller 3 in its entirety moves along the upper surface of the perforated plate 1.

Figure 12B:
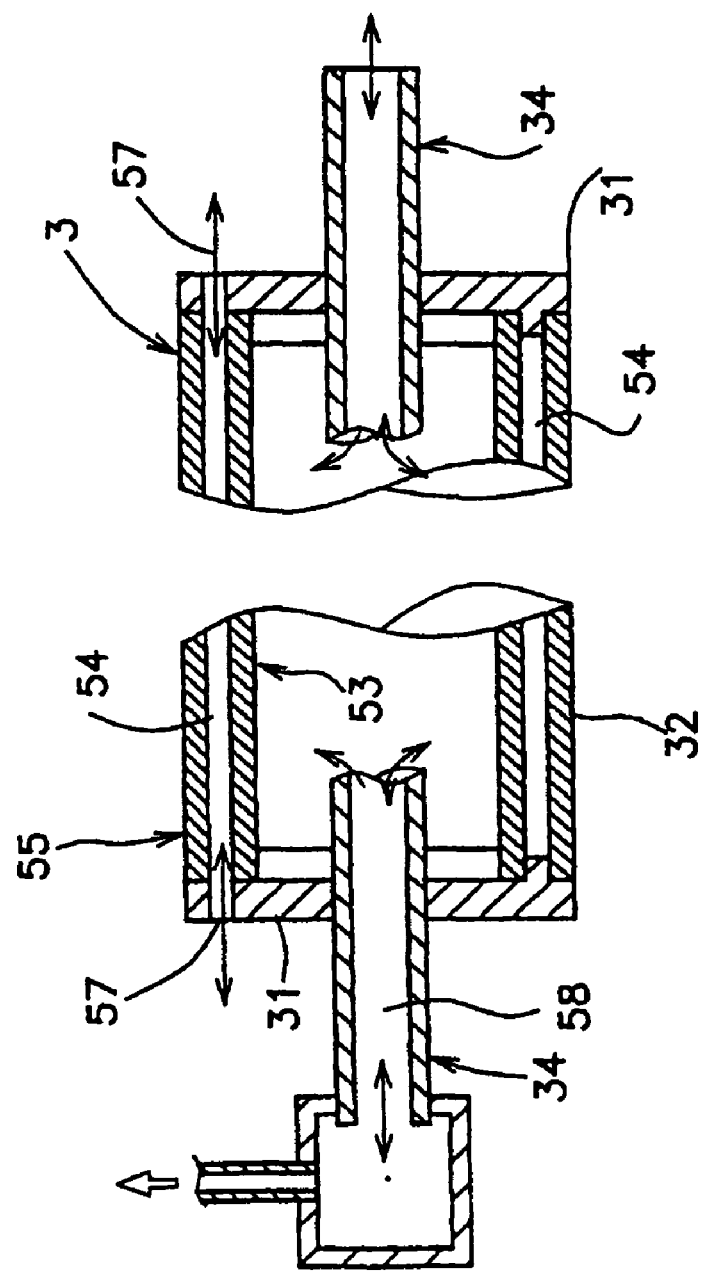
FIG. 12(B) is its end view.

Further, an air may be induced into the clearance gap 54 by the vacuum pump 151. In this case, as shown in FIG. 12(B), both end portions 31 of the roller 3 are formed with a plurality of air holes 57 leading to the clearance gap 54, and at the same time, a pair of support shafts 34 of the roller 3 are applied with hollow shafts, respectively and through inner holes 58 of these hollow shafts, the clearance gap 54 is connected to the vacuum pump 151 as already described. When the vacuum pump 151 is activated, an air is introduced into the inner portion of the roller 3 from a plurality of air holes 57, and further, this air is exhausted outside of the roller 3 by the vacuum pump 151. In this way, since the roller 3 and the rotating machine 50 can be positively cooled, the viscosity of the plastic material m can be reliably stabilized. Further, when the roller 3 is not rotated, it is preferable that the power fed to the rotating machine 50 is completely shut off so that the rotating machine 50 does not discharge an excessive heat.

Further, the peripheral surface 32 of the roller 3 is provided with a lining made of rubber (covering material) so that the plastic material m having adhered to the peripheral surface 32 of the roller 3 is satisfactorily pressed between the roller 3 and the perforated plate 1 or the like, thereby adherence of the plastic material m to the roller 3 may be promoted. Further, since the rubber product is relatively quick in wear, at the time of replacing the lining, it is preferable that the roller 3 be double-structured as described above even in view of being able to take out the cylindrical outer casing 55 only from the roller 3.

Subsequently, when the roller 3 is in the midst of passing through above the perforated plate 1 while rotating, the squeegee 6 is pressed to one side 101 of the perforated plate 1 by the reactive force of a torque by which the roller 3 rotates the rotating machine 50. Hence, the plastic material m pressed between the roller 3, which reciprocates as described above, and the perforated plate 1 is regulated by the squeegee 6 to escape backward from the reciprocating direction of the roller 3. Consequently, while being adequately pressurized between the reciprocating roller 3 and the perforated plate 1, the plastic material m is fed into a through hole pattern 103 (pressure-feeding). In this way, the plastic material m is reliably pressed and filled into one side 21 of the circuit board 2. The degree to which the plastic material m is pressurized as described above can be set as desired by performing adjustment of the printing pressure by taking into consideration the viscosity and the like of the plastic material m, and setting and adjusting a moving velocity of squeegee 6, an angle of squeegee 6, a contact length of resin, and a rotational velocity of roller 3.

In case the perforated plate 1 is omitted, the squeegee 6 may be allowed to directly contact one side 21 of the circuit board 2, but in that case, it is charged with playing a role of opening a printing area widely on the above described pressing plate or pressing frame, and receiving the resin on the substrate without leaving it behind. Further, the squeegee 6, regardless of outgoing or reciprocating of the roller 3, may be horizontally symmetrically shaped as illustrated in FIG. 11 so that a predetermined uniform effect can be achieved, but the shape of both edge portions (upper and lower portions in the drawing) may be asymmetrical. In this case, when the roller 3 outgoes or reciprocates, the plastic material m at the outgoing side is used for pressing and filling, and the angle and contact length of the squeegee 6 is set, and at reciprocating side, the surface of the squeegee 6 is made flat or convex so as to decide the angle and length thereof.

FOURTH EMBODIMENT

Next, another production method of electronic parts will be described. First, as shown in FIG. 13, at a position corresponding to a position directly above an alignment table 12 in a basement 230, a frame body 18 is provided, and a perforated plate 1 is positioned on the frame body 18 in a horizontal position. In the meantime, according to the same procedure, a circuit board 2 is positioned on the alignment table 12 in a horizontal position. By adequately adjusting the height of this circuit board 2, another side 102 of the perforated plate 1 is allowed to approach one side 21 of the circuit board 2.

Subsequently, by adopting the method described as the third embodiment, by a vacuum pump 151, an upper part sealed chamber 13 and a lower part sealed chamber 14 are simultaneously vacuumed. In this process, the voids latent in the plastic material m under the atmospheric pressure can be completely exhausted (de-gassed). By pressure-feeding the plastic material m to a through hole pattern 103 of the perforated plate 1, the plastic material m is pressed and filled into the circuit board 2. Further, between the upper part sealed chamber 13 and the lower part sealed chamber 14 which are separated by the perforated plate 1, the above described differential pressure generating means 15 is activated, thereby generating a differential pressure.

Figure 6B:
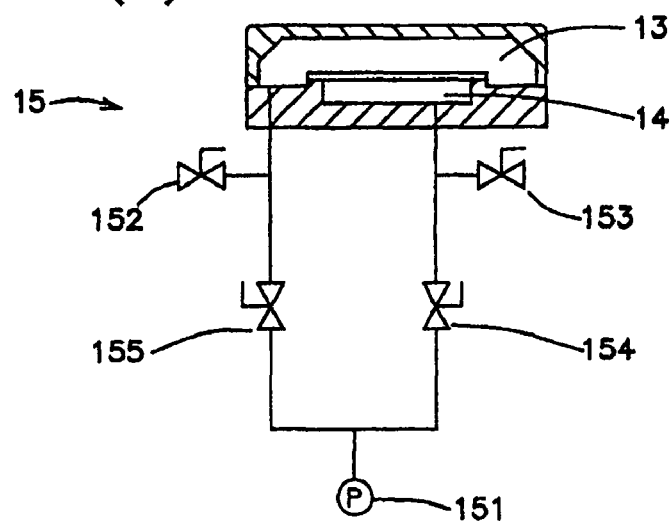
FIG. 6(B) is a pipe arrangement distribution diagram thereof.

When the stop valve 155 shown in the pipe arrangement distribution diagram of FIG. 6(B) is closed and the leak valve 152 is opened, the pressure of the upper part sealed chamber 13 is increased. In this way, the plastic material m is pressed downward from the through hole pattern 103 of the perforated plate 1. Further, when the alignment table 12 is slightly lowered, as shown in FIG. 13, the plastic material m is satisfactorily transferred to the circuit board 2 without being left in the through hole pattern 103. After this, the upper part sealed chamber 13 and the lower part sealed chamber 14 are restored to the atmospheric pressure, and as shown in FIG. 8, when a lid 233 is opened, and further, a frame body 18 and the perforated plate 1 are opened, and the circuit board 2 is taken out from a production unit E2, a series of the production process is completed.

FIFTH EMBODIMENT

Figure 14:
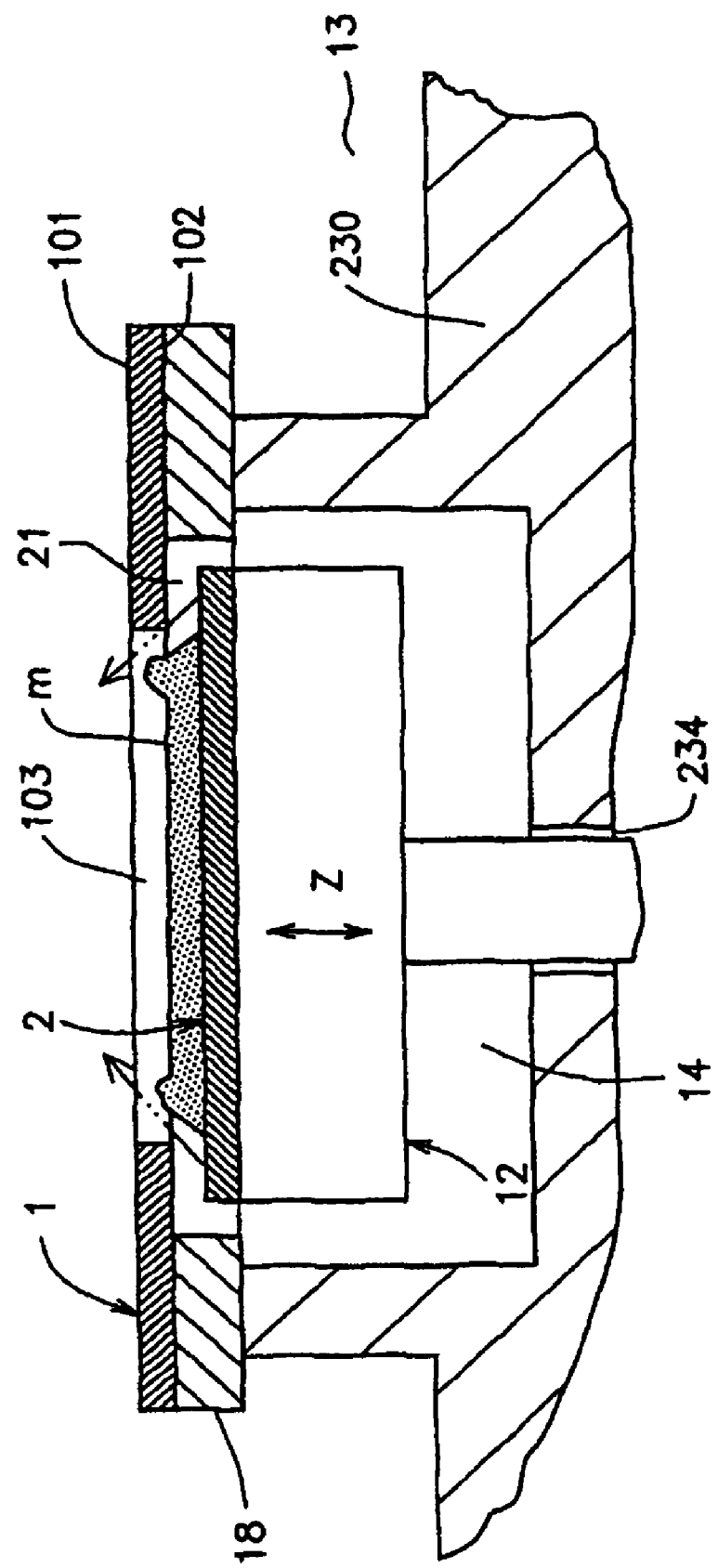
FIG. 14 is a conceptual illustration to show a process of the production method of electronic parts of a fifth embodiment of the present invention.
Figure 15A:
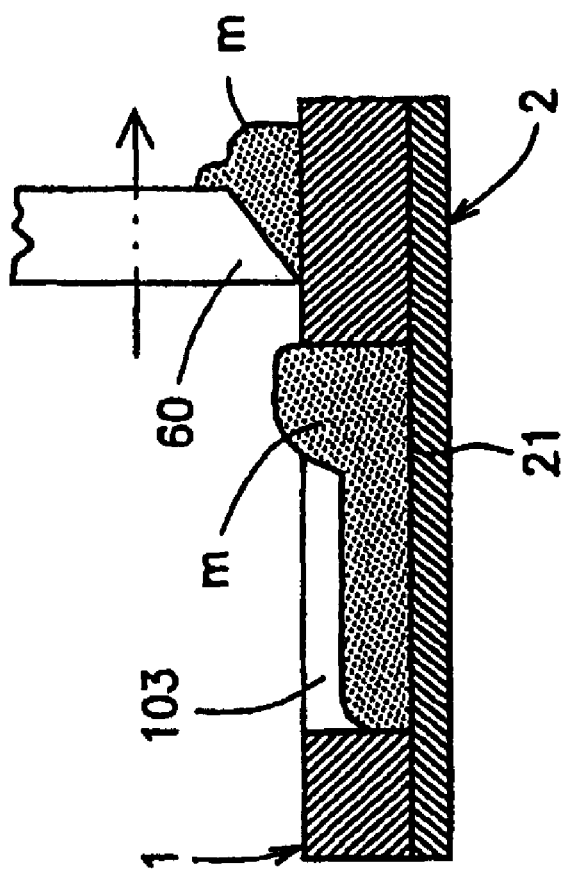
FIG. 15(A) is a conceptual illustration to show a production process of electronic parts by a conventional squeegee.
Figure 15B:
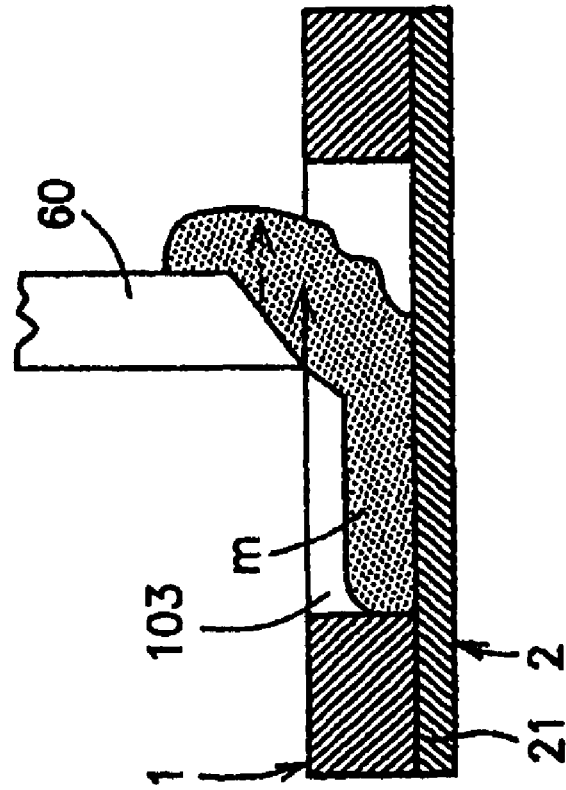
FIG. 15(B) is a conceptual illustration to show its finish.
Figure 16A:
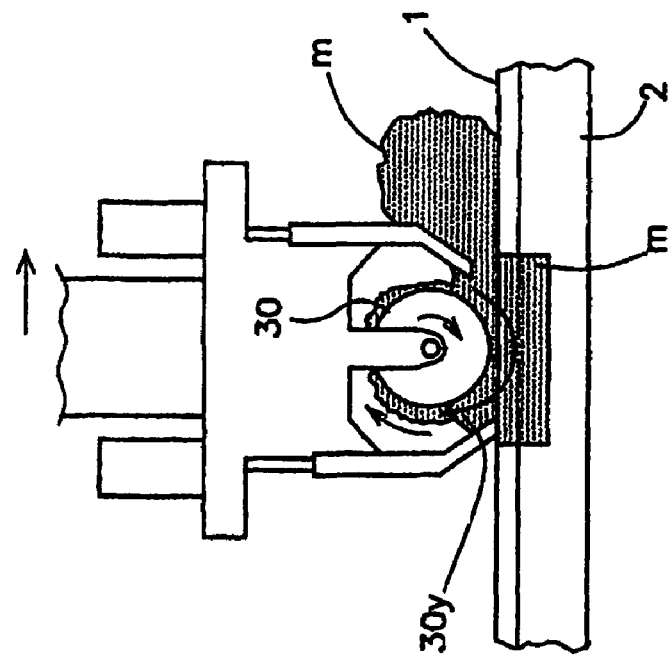
FIG. 16(A) is a conceptual illustration to show one example of the production process of electronic parts by a conventional device.
Figure 16B:
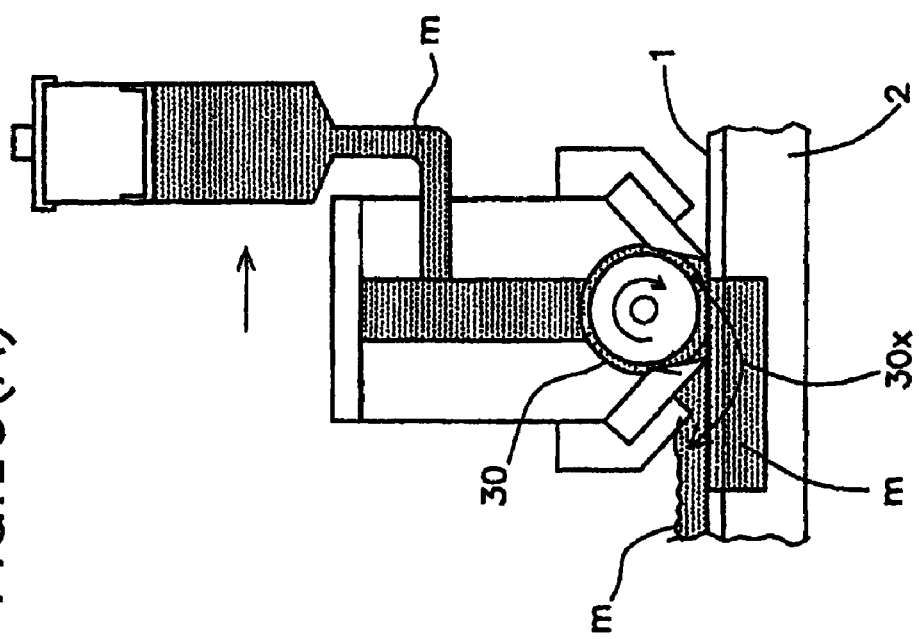
FIG. 16(B) is a conceptual illustration to show another example.
Figure 17:
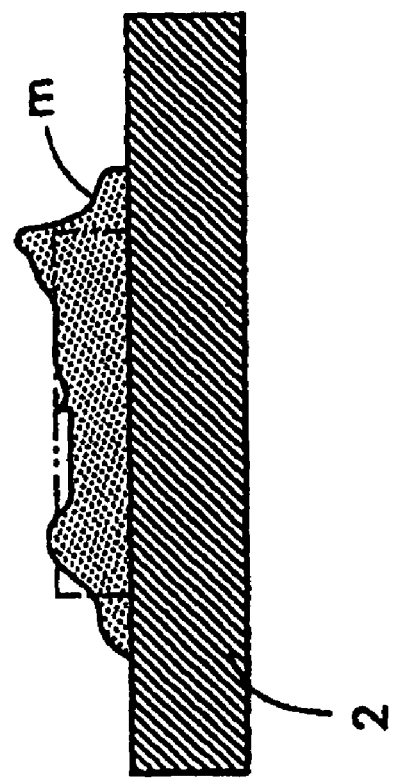
FIG. 17(A) is a conceptual illustration to show the production process of electronic parts by a conventional perforated plate.
FIG. 17(B) is a conceptual illustration to show another example.
Figure 17:
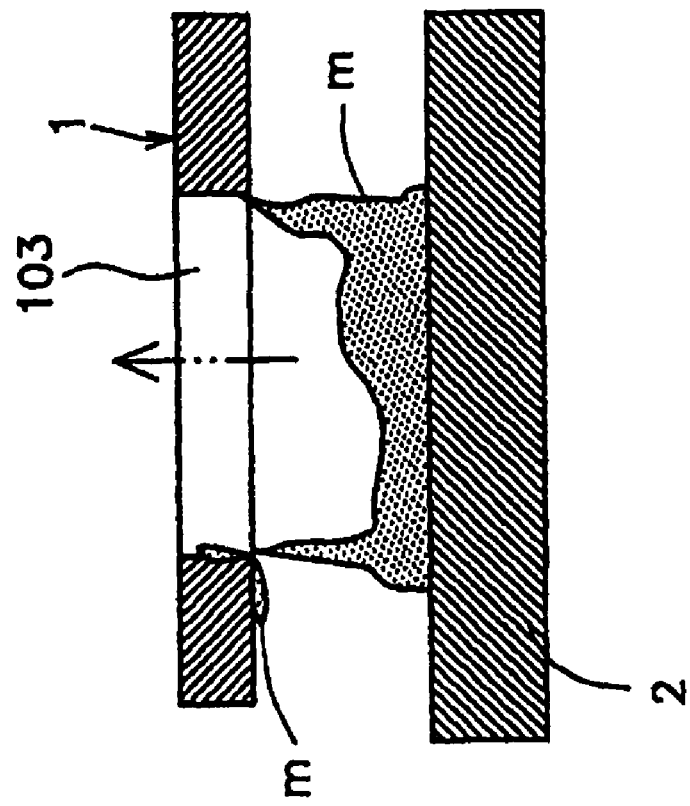

Next, still another production method of the electronic parts will be described. As shown in FIG. 14, the positioning of a perforated plate 1 on a frame body 18, and the positioning of a circuit board 2 in an alignment table 12 are performed similarly to the fourth embodiment. Further, by adequately adjusting the height of a circuit board 2, another side 102 of the perforated plate 1 is allowed to approach one side 21 of the circuit board 2, and in state in which an upper part sealed chamber 13 and a lower part sealed chamber 14 are simultaneously vacuumed by a vacuum pump 151, the pressing and filling of the plastic material m into the circuit board 2 are performed also similarly to the fourth embodiment.

Subsequently, a differential pressure is generated with the perforated plated 1 spaced apart. When the stop valve 154 shown in the pipe arrangement distribution diagram of FIG. 6(B) is closed and the leak valve 153 is slightly opened, the inner pressure of a lower part sealed chamber 14 is increased, and the pressure at another side 102 of the perforated plate 1 becomes higher than at one side 101. In this way, between the plastic material m and the peripheral edge of a through hole pattern 103, a little air of the lower part sealed chamber 14 passes through upwardly, and therefore, the plastic material m is satisfactorily cut off from the peripheral edge of the through hole pattern 103. In case the rigidity of the perforated plate 1 is high and air is prevented from entering the space between the perforated plate 1 and the circuit board 2, by adjusting the height of the alignment table 12, the circuit board 2 is isolated below the perforated plate 1, so that a clearance gap between the circuit board 2 and the perforated plate 1 may be widened.

The upper part sealed chamber 13 and the lower part sealed chamber 14 described in the fourth and fifth embodiments are not necessarily vacuumed, and at least either the air pressure at one side 101 of the perforated plate 1 or the air pressure at another side 102 may be an atmospheric pressure. Further, the plastic material m may be a synthetic resin for insulate-encapsulating the circuit board 2. Alternatively, the plastic material m may be a solder paste to form a solder bump.

The present invention can be applied to various production processes and the like in the field of the resin encapsulation of electronic parts which are surface-mounted on a work piece, the formation of solder bump to the work piece, the hole-plugging of circuit board, the resin coating of the circuit board, and a display.

What is claimed is:

1. A production unit of electronic parts, comprising:
an upper part sealed chamber housing a printing device for pressing and filling a plastic material into a work piece having one side and a perforated plate having a through hole pattern overlaid on one side of said work piece and passable by said plastic material;
a lower part sealed chamber defined below said upper part sealed chamber with said perforated plate intervened between both said chambers and housing an alignment table, said alignment table positioning said work piece in a horizontal position with said one side directed upwardly, the height of said work piece being adjustable; and
differential pressure generating means for generating a differential pressure between said upper part sealed chamber and said lower part sealed chamber;
wherein said differential pressure generating means comprises:
a vacuum pump connected to said upper part sealed chamber and said lower part sealed chamber;
two leak valves connected to said upper part sealed chamber and said lower part sealed chamber, respectively; and
a stop valve opening and closing between said upper part sealed chamber and said lower part sealed chamber and said vacuum pump; and
wherein said vacuum pump vacuums said upper part sealed chamber and said lower part sealed chamber, and after printing, by combination of the operations of said two leak valves and the stop valve, the inflow of atmospheric air to said upper part sealed chamber and said lower part sealed chamber is individually allowed or sealed.

* * * * *